United States Patent
Shirai et al.

(10) Patent No.: US 8,042,727 B2
(45) Date of Patent: Oct. 25, 2011

(54) HEATER, REFLOW APPARATUS, AND SOLDER BUMP FORMING METHOD AND APPARATUS

(75) Inventors: Masaru Shirai, Tokyo (JP); Junichi Onozaki, Tokyo (JP); Hiroshi Saito, Tokyo (JP); Isao Sakamoto, Tokyo (JP); Masahiko Furuno, Tokyo (JP); Haruhiko Ando, Tokyo (JP); Atsushi Hiratsuka, Tokyo (JP)

(73) Assignees: Tamura Corporation, Tokyo (JP); Japan Science and Technology Agency, Saitama (JP)

( * ) Notice: Subject to any disclaimer, the term of this patent is extended or adjusted under 35 U.S.C. 154(b) by 524 days.

(21) Appl. No.: 10/598,142

(22) PCT Filed: Mar. 29, 2005

(86) PCT No.: PCT/JP2005/005909
§ 371 (c)(1),
(2), (4) Date: Aug. 18, 2006

(87) PCT Pub. No.: WO2005/096367
PCT Pub. Date: Oct. 13, 2005

(65) Prior Publication Data
US 2007/0158387 A1     Jul. 12, 2007

(30) Foreign Application Priority Data

Mar. 30, 2004  (JP) ................... 2004/099888
Mar. 31, 2004  (JP) ................... 2004/102407

(51) Int. Cl.
*B23K 31/02* (2006.01)
(52) U.S. Cl. ............... 228/234.1; 432/152; 266/105
(58) Field of Classification Search ........... 228/234.1; 432/152; 266/105
See application file for complete search history.

(56) References Cited

U.S. PATENT DOCUMENTS
3,205,572 A    9/1965 Jochems
(Continued)

FOREIGN PATENT DOCUMENTS
JP    01-157796    6/1989
(Continued)

OTHER PUBLICATIONS

U.S Appl. No. 10/598,124 to Sakamoto et al., which was filed on Aug. 18, 2006.
(Continued)

*Primary Examiner* — Jessica L Ward
*Assistant Examiner* — Nicholas D'Aniello
(74) *Attorney, Agent, or Firm* — Greenblum & Bernstein P.L.C.

(57) ABSTRACT

An apparatus characterized by a feature that in a stage on which a substrate or a jig holding a substrate is mounted, an opening closed when the substrate or the jig is mounted is provided and the substrate or the jig is heated by blowing hot air against the lower portion of the substrate or the jig and by a feature that a solder bump is formed on a pad electrode by heating or reflowing a solder composition which is a mixture containing solder particles, a flux component, and a liquid material which is liquid at normal temperature or changing to liquid when heated, and the composition is heated from the substrate side. With the former feature, oxidization of the solder paste on the substrate where no hot air comes and adhesion of particles to the substrate can be prevented, and with the latter feature, solder particles near the pad electrode are melted earlier and wet and spread over the pad electrode, solder particles above and far from the pad electrode are not melted sufficiently, and an effect of reducing the possibility that solder particles join together can be expected.

6 Claims, 15 Drawing Sheets

U.S. PATENT DOCUMENTS

| | | | |
|---|---|---|---|
| 4,334,646 A | * | 6/1982 | Campbell ................ 228/180.21 |
| 4,561,584 A | | 12/1985 | Hug |
| 5,338,008 A | * | 8/1994 | Okuno et al. ................ 266/105 |
| 6,123,247 A | | 9/2000 | Shibo et al. |

FOREIGN PATENT DOCUMENTS

| | | |
|---|---|---|
| JP | 5-000391 | 1/1993 |
| JP | 05-092257 | 4/1993 |
| JP | 11-068303 | 3/1999 |
| JP | 11-251737 | 9/1999 |
| JP | 2000-094179 | 4/2000 |
| JP | 2001-068848 | 3/2001 |
| JP | 2002-353612 | 12/2002 |
| JP | 2002-374063 | 12/2002 |

OTHER PUBLICATIONS

English language Abstract of JP 11-068303.
English language Abstract of JP 11-251737.
English language Abstract of JP 2001-068848.
English language Abstract of JP2000-094179.
English language Abstract of JP 05-092257.
English language Abstract of JP 01-157796.
English language Abstract of JP 5-000391.
English language Abstract of JP 2002-353612.
English language Abstract of JP 2002-374063.

* cited by examiner

FIG. 3
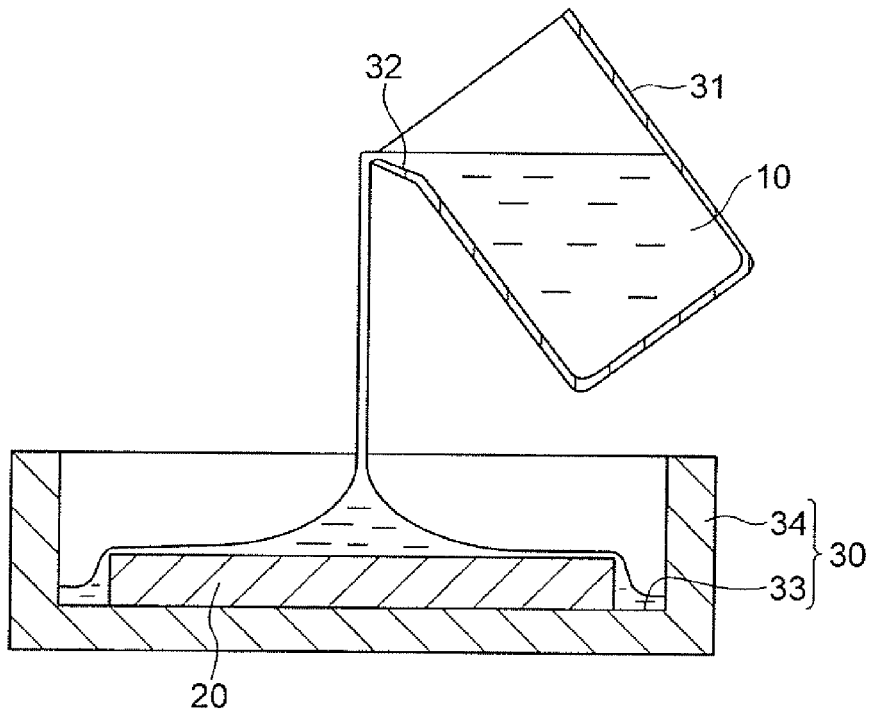
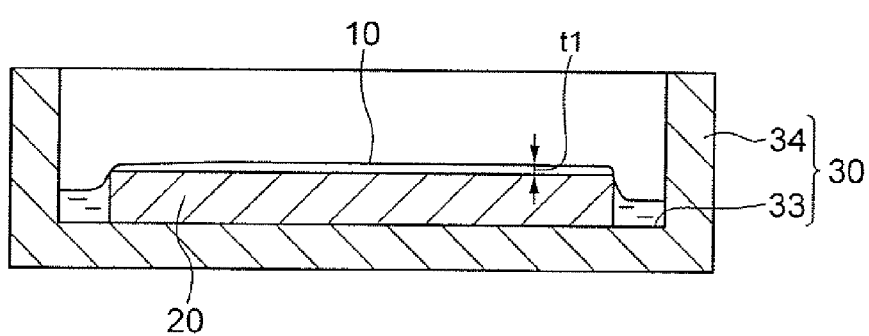
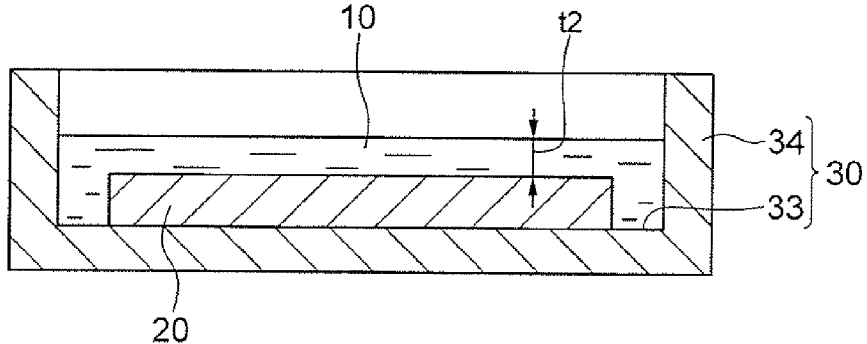

FIG. 4
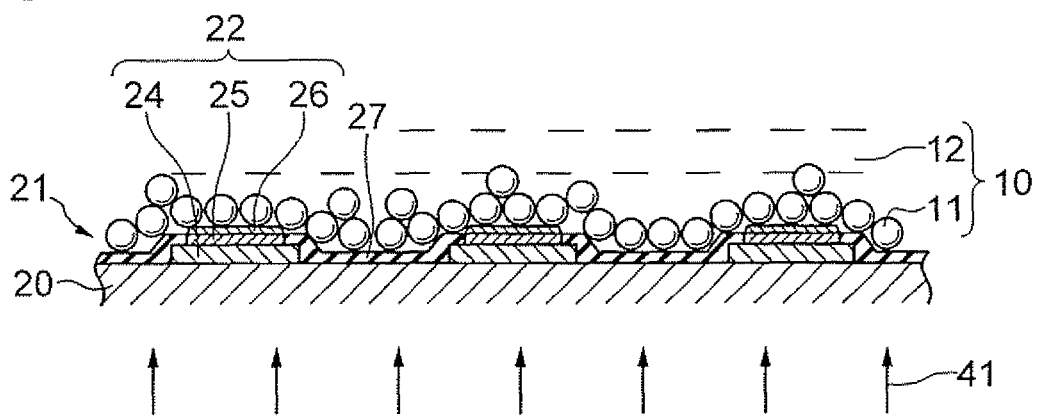
[2]
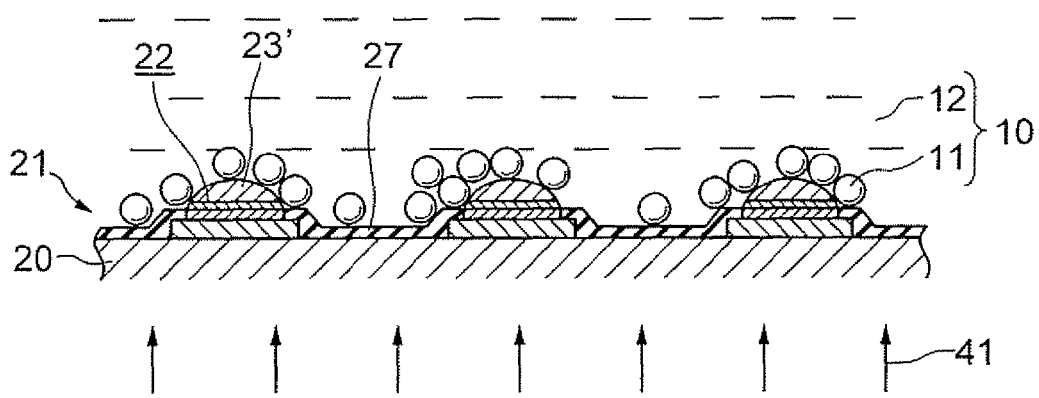
[3]
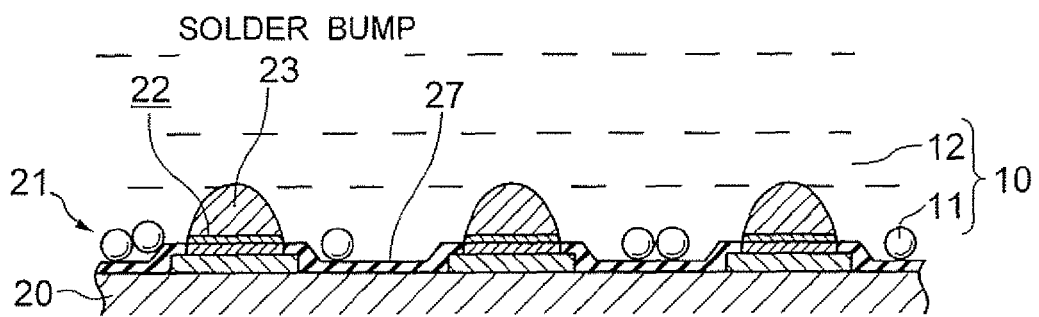

FIG. 5
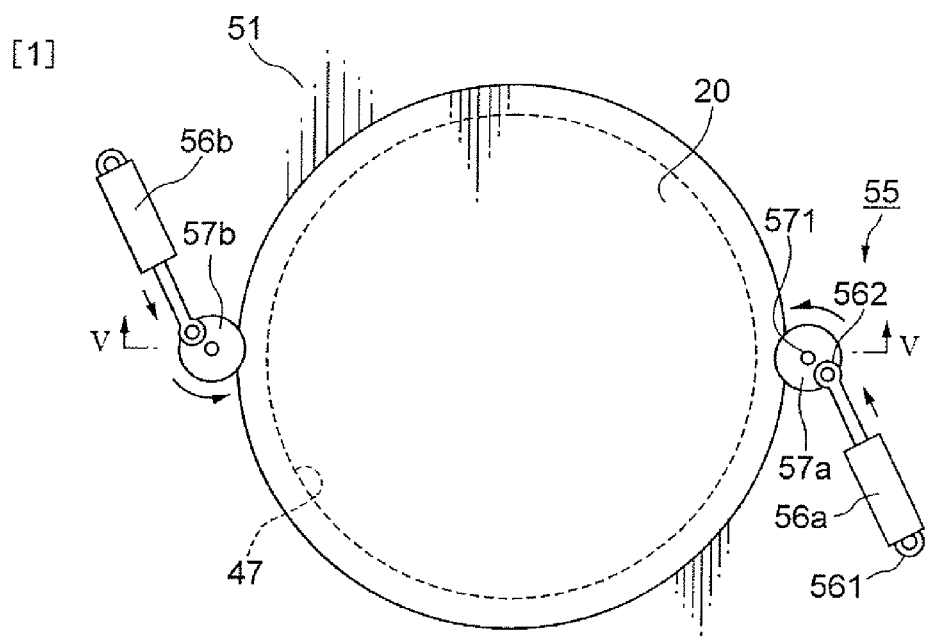
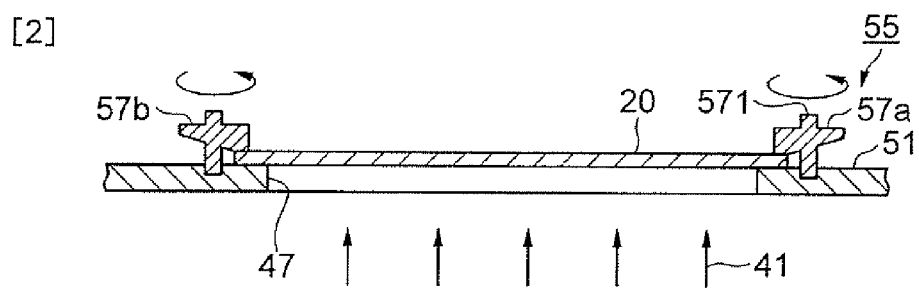

FIG. 12
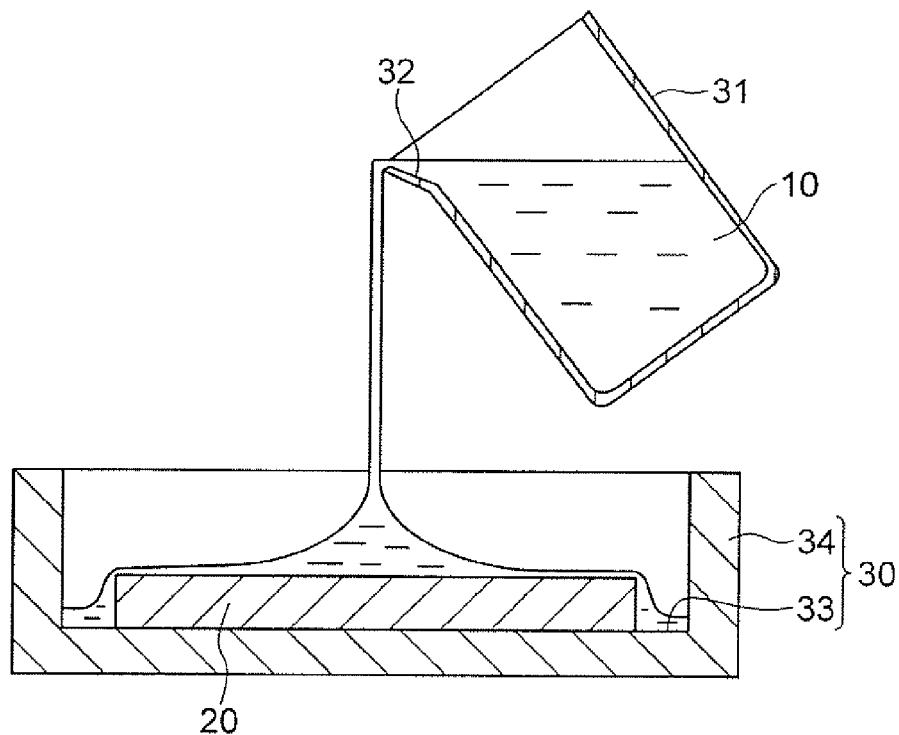
[2]
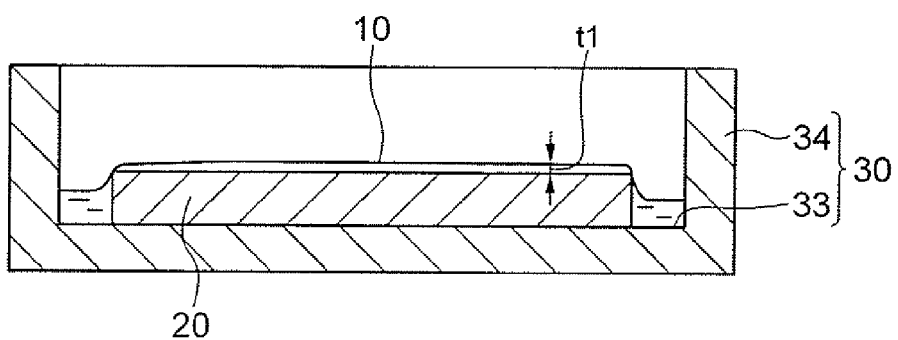
[3]
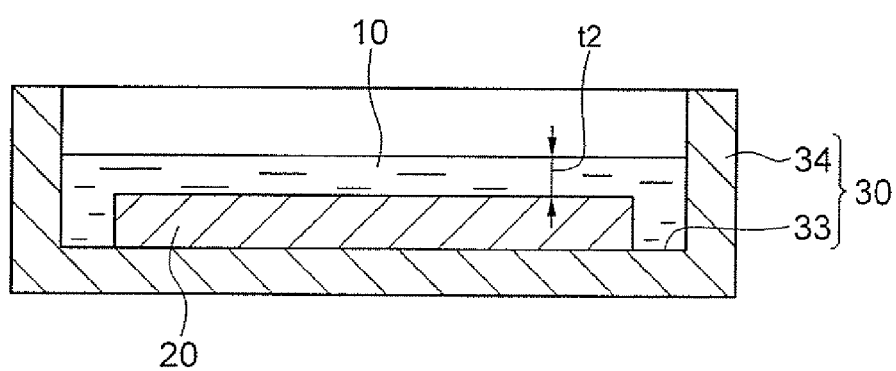

FIG. 13
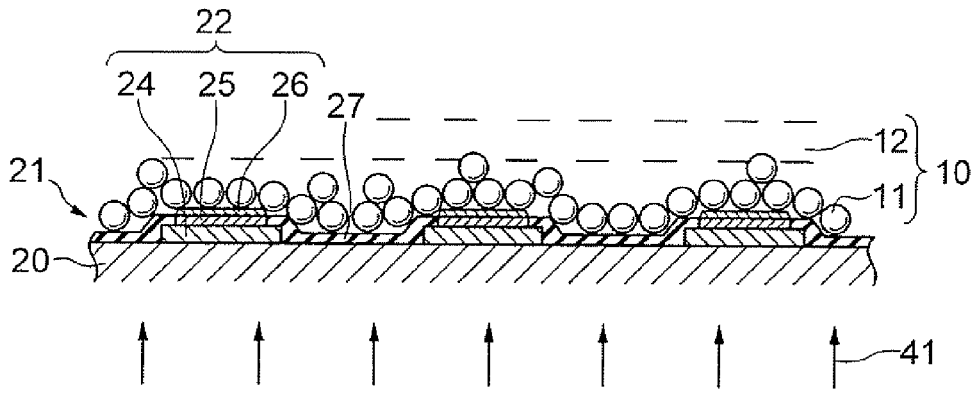
[2]
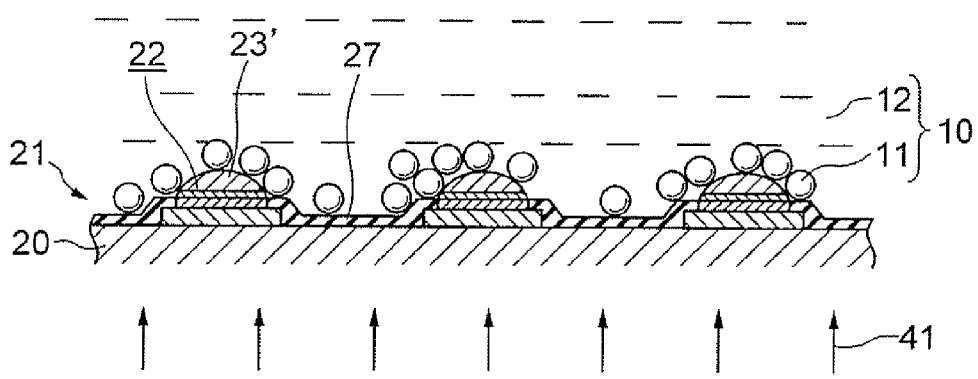
[3]
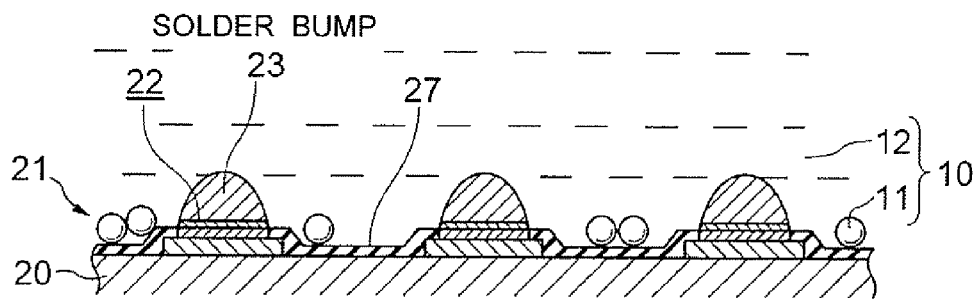

HEATER, REFLOW APPARATUS, AND SOLDER BUMP FORMING METHOD AND APPARATUS

TECHNICAL FIELD

The present invention relates to a heater that is optimum for heating solder, for example, and a reflow apparatus using the heater. Furthermore, it relates to bump forming method and apparatus which are used when manufacturing FCs (flip chips) and BGAs (ball grid arrays) by forming protruded solder bumps on a semiconductor substrate and interposer substrate, for example.

BACKGROUND ART

In a typical conventional forming method of solder bumps, solder paste is applied on pad electrodes of a substrate by screen printing or a dispensing method, and the solder paste is heated for reflow. The solder paste is also referred to as "cream solder".

Patent Literature 1 discloses an example of the above-described solder paste. The solder paste depicted in Patent Literature 1 is obtained by forming an oxide film on the surfaces of solder particles by making the solder particles flow in the air. It is noted that the oxide film formed forcibly functions to suppress coalescence of the solder particles against the effect of flux at the time of reflow. Thus, it is understood that when performing reflow after applying the solder paste all over the substrate, a solder bridge between the pad electrodes is not easily generated. Therefore, it is suitable for enabling densification and micronization of the pad electrodes. The solder bridge between the pad electrodes is a phenomenon that occurs when the solder particles are united with each other to form a large lump, and come in contact with both of the adjacent pad electrodes.

A reflow apparatus is used in a reflow process. As the reflow apparatus, there is known a type in which a substrate is placed directly on a panel heater for heating the substrate by conduction of the heat from the panel heater (first conventional example). However, this reflow apparatus has such a shortcoming that heat distribution of the substrate becomes non-uniform with a slight warp or unevenness of the substrate. There is also known a reflow apparatus in which a space is provided between the panel heater and the substrate for heating the substrate by thermal radiation from the panel heater (second conventional example). However, this reflow apparatus has such a shortcoming that the heating power thereof is insufficient. There has been developed a reflow apparatus (third conventional example, e.g. Patent Literature 2 mentioned below) that heats the substrate by applying hot air thereto for overcoming the shortcomings of the first and second conventional examples. With this reflow apparatus, a space is provided between a hot-air ejection nozzle and the substrate for heating the substrate by blowing hot air from the top and bottom part of the substrate. Therefore, the substrate can be heated uniformly and a sufficient heating power can be obtained as well.

Patent Literature 1: Japanese Unexamined Patent Publication 2000-94179
Patent Literature 2: Japanese Unexamined Patent Publication H5-92257

However, the conventional solder bump forming method has following shortcomings.

It has become difficult with the screen printing and dispensing method to cope with more densification, micronization and increased number of electrodes these days. That is, the screen printing needs to micronize the opening of a metal mask, which causes such issues that the mechanical strength of the metal mask is deteriorated and it becomes hard for the solder paste to be ejected from the opening of the metal mask. In the dispensing method, the solder paste is applied on a large number of pad electrodes one by one. Thus, it becomes unsuitable for mass production as the number of pad electrodes increases.

In the meantime, it is necessary with the solder paste of Patent Literature 1 to form the thickness of the oxide film of the solder particles with a fine precision. The reason is that the solder is not wetted over the pad electrode when the film is too thick, and the solder particles are united with each other when it is too thin. Moreover, the effect of the flux changes in accordance with the state or the kinds of the flux, so that it is also necessary because of these reasons to control the thickness of the oxide film with a fine precision. Meanwhile, densification and micronization of the pad electrodes cannot be achieved without forming the oxide film in a proper film thickness. Thus, even though the solder paste of Patent Literature 1 can be applied solid without requiring any precision mask, it is still difficult to meet a demand for densification and micronization of these days.

Further, with the reflow apparatus of the third conventional example, there have been cases where the solder bumps cannot be formed due to oxidation of the solder paste on the substrate. This is considered because many heated oxygen molecules come in contact with the surface of the solder paste because hot air is used therewith. Furthermore, there is also such a shortcoming that the quality of the solder bumps becomes unstable by the effect of the hot air when the hot air is directly blown to the fine electrodes for forming the solder bumps. Further, the particles may attach to the solder bumps by being blown to the substrate with the hot air. This can also be caused when the hot air is blown only from the bottom part of the substrate, since the hot air beneath the substrate moves around towards the above the substrate.

An object of the present invention is to provide solder bump forming method and apparatus, which can meet the demands for densification and micronization of solder bumps of these days. Furthermore, it is an object of the present invention to provide a heater, a reflow apparatus and the like with which: oxidation of the solder paste can be suppressed even when heat is applied by hot air; the quality can be made stable; and the effect of the particles is small A still further object of the present invention is to provide a heater, a reflow apparatus and the like with which the solder bumps can be formed by a liquid solder composition even when heat is applied by hot air.

DISCLOSURE OF THE INVENTION

In order to achieve the foregoing objects, the solder bump forming method according to the present invention comprises an application step for depositing a solder composition in layers on a substrate having a plurality of pad electrodes provided thereon with a space therebetween; and a reflow step for heating to reflow the solder composition on the substrate side. The solder composition to be used is made of a mixture of solder particles and a liquid material that contains a flux component, which becomes liquid at a normal temperature or while heated. In the reflow step, the solder composition is heated from the substrate side.

The solder composition is in a liquid state at a normal temperature or becomes liquid while heated. In order to attain such characteristic (flow characteristic), it is necessary for the liquid material to have low viscosity, the mixing ratio of the solder particles to be small, and the grain diameter of the solder particle to be small. While heated, the solder particles float or precipitate in the liquid material. A conventional solder paste can be included in the solder composition as long as it can be in a liquid state while heated.

When the solder composition on the substrate is heated from the substrate side, the temperature of the solder composition becomes lower towards the top-face side and becomes higher towards the substrate side. Thus, the lower solder particles near the pad electrode start to melt first and, when melted, they are wet and spread over the pad electrodes. At that time, the upper solder particles far from the pad electrode have not sufficiently been melted yet. Thus, it is possible to reduce the risk of uniting the solder particles with each other, thereby suppressing generation of solder bridges as well.

Further, in the application step, the solder composition may be deposited in layers all over the face including the plurality of pad electrodes and gaps therebetween. That is, it can be applied all over with so-called "solid application" by screen printing or using a dispenser (ejecting device). Even when the solder composition is placed between the pad electrodes, coalescence of the solder particles can be suppressed at the time of reflow. Thus, generation of solder bridges between the pad electrodes can be suppressed as well. Therefore, the solder bumps can be formed densely and finely even by solid application that requires no precision, without using a metal mask processed in high precision.

In the reflow step, first, the pad electrodes may be heated to a melting point of the solder particles or higher for melting the solder particles that are in contact with the pad electrodes so as to form a solder coating wet and spread over the pad electrodes. Moreover, the solder particles may be united with the solder coating. Such heating state can be achieved by controlling the temperature profile and the temperature distribution.

In the reflow step, the solder particles closer to the substrate side may be precipitated first by providing a temperature difference such that a heating temperature of the solder composition on a substrate side is higher than a heating temperature on a top-face side. By providing such temperature difference that the top-face side of the solder composition is lower and the substrate side is higher, the lower solder particles near the pad electrode precipitate and start to melt first, and become wet and spread when coming in contact with the pad electrode, since the viscosity of the liquid material deteriorates more as the temperature becomes higher. In that state, the upper solder particles far from the pad electrode are not sufficiently precipitated and melted. Thus, the risk of uniting the solder particles with each other can be more reduced, so that generation of the solder bridges can also be suppressed more. Further, such heating state can be achieved by controlling the relation between the temperature dependency of the viscosity of the liquid material and the melting point of the solder particles, in addition to controlling the temperature profile and the temperature distribution.

In the reflow step, the solder particles may be supplied to the pad electrodes by utilizing the convection of the liquid material. When the solder composition is heated from the substrate side, convection is generated in the liquid material so that the solder particles move within the liquid material. Thus, the solder particles that are not placed on the pad electrode are shifted on the pad electrode to be a part of the solder bumps. Thereby, the solder particles can be effectively utilized.

In the reflow step, the substrate may be placed within a container and heat may be applied while the substrate is immersed in the solder composition placed within the container. While heating, the liquid solder composition is filled also in the gaps between the substrate and the container. Thus, the thermal conduction from the container Lo the substrate becomes uniform. Further, with the solder paste of the related art, the printing thickness or the content of the solder particles are controlled for changing the size (height) of the solder bump. In the present invention, however, the thickness of the solder composition on the substrate can be changed at will by controlling the deposit amount of the solder composition. Therefore, the size (height) of the solder bumps can be changed easily.

The solder bump forming apparatus according to the present invention is for forming the solder bumps through heating and reflowing the solder composition on the substrate where a plurality of pad electrodes are provided with a space therebetween. The solder composition to be used is made of a mixture of solder particles and a liquid material with a flux effect, which has a characteristic of becoming liquid at a normal temperature or while heated. In addition, the solder bump forming apparatus according to the present invention comprises a heating device for heating the solder composition from the substrate side. It may be provided further with a thermostat device for controlling the temperature of the solder composition on the substrate. In this case, it is possible to achieve a desired state of the temperature difference where the top-face side of the solder composition is lower and the substrate side is higher.

Furthermore, there may be provided a container for housing the substrate and the solder composition on the substrate, and the heating device may heat the solder composition from the substrate side through the container. At this time, the substrate may be a flat plate and the container may comprise a flat bottom face for placing the substrate and a surrounding wall for suppressing the lateral overflow of the liquid solder composition. In this case, the substrate comes in contact closely with the bottom face of the container, so that the thermal conduction is improved. The solder bump forming apparatus according to the present invention also exhibits the effect equivalent to that of the above-described solder bump forming method of the present invention.

Next, an example of the solder composition used in the present invention will be described. The liquid material of the solder composition is a liquid body, for example. The liquid body contains a flux component whose reaction temperature is close to the melting point of the solder particle, which has such a viscosity that it flows at a normal temperature and deposit in layers on a base material. The solder particles are granular agents that precipitate in the liquid body towards the base material, having the mixing ratio and the grain diameter to be uniformly dispersible within the liquid body.

The solder composition when dropped on a plane at a normal temperature spreads by the weight of itself to be in a uniform thickness. It is therefore completely different from the solder paste in this respect. In order to attain such characteristic (flow characteristic), it is necessary for the liquid material to have low viscosity at a normal temperature, the mixing ratio of the solder particles to be small, and the grain diameter of the solder particle to be small. For example, the mixing ratio of the solder particles is preferable to be 30 wt % or less, more preferable to be 20 wt % or less, and most preferable to be 10 wt % or less. The grain diameter of the solder particle is preferable to be 35 $\mu$m or less, more preferable to be 20 $\mu$m or less, and most preferable to be 10 $\mu$m or less.

The solder composition may have a following constitution. The surface oxide films of the solder particles contain only natural oxide film. The flux component of the liquid body, when heated to the melting point of the solder particles or higher, suppresses coalescence of the solder particles by the reaction product thereof, while accelerating soldering between the solder particles and the base material as well as the coalescence of the solder particles with the solder coating formed on the base material. The component with such flux effects has been found by the inventors of the present invention through repeated experiments and studies.

An example of such component may be acid. Acid can be classified roughly into inorganic acid (e.g. hydrochloric acid) and organic acid (e.g. fatty acid). Description herein will be provided by referring to the organic acid.

The inventors of the present invention has found that "organic acid has a small effect for uniting the solder particles with each other but a large effect for generating solder wet on the pad electrode". The following (1) and (2) can be considered as the reasons for producing such effects.

(1) Organic acid has a weak effect for eliminating the oxide films of the solder particles. Thus, coalescence of the solder particles can be suppressed by the natural oxide film of the solder particles without intentionally forming the oxide film on the solder particles. Therefore, the present invention requires no step for forming the oxide film on the solder particles. In the related art disclosed in Patent Literature 1, however, the effect of the flux is too strong. Thus, the solder particles are united with each other unless a thick oxide film is formed on the solder particles.

(2) Organic acid has an effect of spreading the solder particles on the base material and alloying the interface as well as uniting the solder particles with the solder coating formed on the base material. The mechanism that generates the solder wet on the base material having almost no coalescence Of the solder particles is not clear. It is assumed that there is some kind of reaction occurred for slightly breaking the oxide film between the solder particles and the base material. For example, with the gold-plated base material, there is generated solder wet due to the diffusion effect of gold into the solder even if there is a thin oxide film on the solder particles, for example. In the case of a base material made of copper, copper reacts with the organic acid and becomes organic acid copper salt. When the organic acid copper salt comes in contact with the solder, it is deoxidized due to a difference of ionization tendencies. Thus, metal copper is diffused into the solder so that the solder wet is promoted. For the reason for uniting the solder particle with the solder coating formed on the base material, the surface tension may be considered, for example.

The liquid body mixed with the solder particles may be a fat and fatty oil, and the component contained in the liquid body may be free fatty acid contained in the fat and fatty oil. Fats and fatty oils are widely distributed on the market for various purposes, so that they are easily obtained at low cost and are nontoxic as well. In addition, the fat and fatty oil originally contains organic acid called free fatty acid. Particularly, fatty ester (e.g. neopentylpolyol ester) is generally excellent in thermal and oxidation stability, so that it is optimum for soldering. Further, for the sufficient content of the free fatty acid, it is preferable for the acid value of the fat and fatty oil to be 1 or more. The acid value is the amount in milligrams of potassium hydroxide necessary for neutralizing the free fatty acid contained in the fat and fatty oil. That is, the larger acid value indicates that there is more free fatty acid contained. The main characteristic of trimethylpropane-trioleate is that the kinematic viscosity at 40° C. is 48.3 $mm^2/s$, the kinematic viscosity at 100° C. is 9.2 $mm^2/s$, and the acid value is 2.4.

The fat and fatty oil used in the solder composition of the present invention exists until the solder bumps are completely formed, which prevents the direct contact of the solder and air during that Lime for suppressing oxidation of the solder. The content of organic acid contained in the fat and fatty oils is controlled so that even though it contributes to eliminate the oxide film on the solder surface, it does not completely eliminates the oxide film of the solder surface. With this, it is possible to achieve the state capable of soldering to the surface of the base material while suppressing coalescence of the solder particles with each other. For the organic acid, there is required the amount sufficient to eliminate the oxide film on the surface of the base material. For that, the acid value of the fat and fatty oil is preferable to be 1 or more.

The solder composition used in the present invention may contain organic acid in the fat and fatty oil. The organic acid may be either the one originally contained in the fat and fatty oil or the one added afterwards. Organic acid exhibits the effect of deoxidizing the oxide films of the solder particles and the base material. Further, the inventors of the present invention have found that soldering to the base material can be achieved while suppressing coalescence of the solder particles with each other by remaining a slight amount of the oxide film on the surfaces of the solder particles through properly controlling the amount of the organic acid in the fat and fatty oil. Furthermore, the inventors also have found that, when tin is contained in the solder, organic acid tin salt is obtained as a by-product during the process of deoxidizing the oxide film on the surface of the solder by the organic acid, and the organic acid tin salt dramatically suppresses coalescence of the solder particles. Through controlling these phenomena, it is possible to form the solder bump that does not generate short-circuit on the pad electrode, for example, while preventing coalescence of the solder particles with each other.

The "solder" herein includes not only those used for forming the solder bumps but also those called "soft solder" and the like used for die-bonding semiconductor chips and for connecting copper pipes, for example. Needless to say, lead-free solder is also included. The "solder bump" is not limited to a hemispherical type or protruded type, but a film type is also included. It is noted that the "solder coating" is not limited to a film type, but a hemispherical type and a protruded type are also included. The "substrate" includes a semiconductor wafer and a wiring board. The "liquid body" may be a fluid body other than a liquid, and fluorine high-boiling solvent or fluorine oil may be used other than the fat and fatty oils.

The solder bump forming method according to the present invention uses the solder composition having such a characteristic that it becomes liquid at a normal temperature or while heated and heats the solder composition on the substrate from the substrate side. With this, it is possible to produce the state where the lower solder particles near the pad electrodes are melted first to be wet and spread over the pad electrodes while the upper solder particles far from the pad electrodes are not sufficiently melted. Thus, the risk of uniting the solder particles with each other can be more reduced, so that generation of the solder bridges can also be suppressed. Therefore, the solder bumps can be formed densely and finely.

Further, even if the solder composition is applied on the substrate with solid application, generation of the solder bridges can be suppressed since coalescence of the solder particles at the time of reflow can be suppressed. Thus, the solder bumps can be formed densely and finely by a simple and easy method.

Furthermore, through heating the solder composition on the substrate from the substrate side and controlling the temperature of the solder composition from the top-face side, it is possible to provide a desired temperature distribution where the solder composition on the substrate side is higher and the top-face side thereof is lower.

Moreover, precipitating the solder particles from those near the substrate side first allows the lower solder particles near the pad electrodes to precipitate and melt first to be wet and spread over the pad electrodes while the upper solder particles far from the pad electrodes do not sufficiently precipitate and melt. Thus, the risk of uniting the solder particles with each other can be more reduced, so that generation of the solder bridges can be suppressed more.

Further, by moving the solder particles through utilizing the convection of the liquid material at the time of reflow, the solder particles that are not placed on the pad electrodes can be guided on the pad electrodes. Thus, the solder particles can be effectively utilized without a waste.

Furthermore, by placing the substrate in a container and heating the substrate while it is immersed in the solder composition within the container, heat can be applied by filling the gaps between the substrate and the container with the liquid solder composition. Thus, thermal conduction from the container to the substrate can be made uniform. Therefore, a large number of solder bumps can be formed simultaneously under the same condition, so that variations in the solder bumps in manufacture can be reduced. In addition, by controlling the amount of the solder composition to be placed on the substrate, the size (height) of the solder bumps can be changed easily.

The heater according to the present invention comprises: a mount plate on which the substrate or a jig holding the substrate is loaded (the substrate or the jig is referred to as "the substrate or the like" hereinafter); an opening formed on the mount plate, which is covered by placing the substrate or the like; and a heating device for applying heat by blowing hot air to the bottom of the substrate or the like through the opening. When the substrate or the like is placed on the mount plate, the opening is covered by the substrate or the like. Thus, the hot air is simply blown to the bottom side of the substrate or the like at the opening and not blown out from the opening. Therefore, the hot air does not move around to the above the substrate so that oxidation of the solder paste on the substrate can be suppressed. Further, even though the heater according to the present invention is a device for applying heat by using hot air, it can form the solder bumps with a liquid solder composition. The first reason for this is that oxidation of the solder composition can be suppressed like the case of the solder paste. The second reason is that the temperature distribution of the solder composition becomes lower on the top-face side and higher on the substrate side. It is considered that the solder bumps can be formed with the liquid solder composition due to at least one of those reasons. The second reason will be described later.

There may be provided a hot-air circulation path further for returning the hot air blown to the bottom side of the substrate or the like to the heating device again. In this case, diffusion of the hot air can be suppressed, so that the hot air that may move around towards the above the substrate can be reduced more. Moreover, heat can be utilized efficiently, thereby saving the energy.

Further, a thermostat device may be provided further for controlling the temperature of the substrate. In this case, an unnecessary increase in the temperature on the substrate can be prevented so that oxidation of the solder paste on the substrate or the liquid solder composition (referred to as "solder paste or the like" hereinafter) on the substrate can be suppressed more. The thermostat device comprises, for example, a heat absorbing plate and an endothermic section for cooling the heat absorbing plate positioned above the substrate with a distance therebetween. The endothermic section is constituted with an air cooling mechanism or a water cooling mechanism, for example. Further, the thermostat device may be in a structure comprising a radiation plate for heating the substrate by radiant heat and a heating section for heating the radiation plate.

There may be provided a holding mechanism further for securing the substrate or the like to the mount plate. The substrate or the like may be blown out or shifted of L by the hot air depending on the weight of the substrate or the like or the pressure of the hot air. In such case, the holding mechanism is provided for securing the substrate or the like.

The jig may be a container for holding the substrate by immersing it in the liquid solder composition. In that case, the container may comprise a flat bottom face for placing the substrate and a surrounding wall for preventing lateral overflow of the solder composition. While heating, the liquid solder composition is also filled in the gaps between the substrate and the container. Thus, thermal conduction from the container to the substrate can be made uniform. Furthermore, with the solder paste in the related art, the size (height) of the solder bumps is changed by controlling the thickness of printing or the content of the solder particles. In the present invention, however, the liquid solder composition and the container are used. Therefore, the thickness of the solder composition on the substrate can be changed at will by simply controlling the amount of the solder composition to be placed. Thus, the size (height) of the solder bump can be changed easily. For the solder composition, there may be used the one that becomes liquid while heated, even though it does not become liquid at a normal temperature.

The reflow apparatus according to the present invention is provided with at least one each of the preliminary heating section, the reflow section, and the cooling section arranged in this order, in which the substrate or the like is transported by a transporting mechanism in this order and respective actions of the preliminary heating section, the reflow section, the cooling section, and the transporting mechanism are controlled by a controlling device. The preliminary heating section and the reflow section are constituted with the heater of the present invention. By using the heater of the present invention for the preliminary hating section and the reflow section, oxidation of the solder paste or the like on the substrate can be suppressed. The cooling section may be omitted. The heating device may be the kind that applies heat by hot air or the kind that applies heat by thermal conduction.

The preliminary heating section, the reflow section, and the cooling section may be arranged on a concentric circle. In this case, the entrance and exit of the substrate or the like for transportation become the same place. Therefore, compared to the case where those are arranged linearly, transport processing of the substrate or the like becomes easy and the overall structure becomes simple and small-sized as well.

The transporting mechanism may comprise a vertical motion mechanism for moving the substrate or the like vertically with respect to the mount plate. In this case, the substrate or the like can be moved vertically to be placed or brought up on/from the mount plate. The transporting mechanism may be the kind that transports the substrate or the like by keeping the level state without moving it vertically.

The control device may stop the action of the hot-air generating unit when the opening is not covered by the substrate or the like. In this case, it is possible to prevent the blow-out of the hot air from the opening when the opening is not covered by the substrate or the like.

In the method of using the reflow apparatus according to the present invention, a dummy substrate or the like is fed before, after, or in the middle of a plurality of the substrates or the like when performing processing by successively feeding the plurality of substrates or the like. The dummy substrate or the like suppresses blow-out of the hot air from the opening when the opening is not covered by the substrate or the like, and suppresses fluctuation of the thermal capacity in terms of the heater as well. The dummy substrate or the like may be in the same shape as that of the substrate or the like. In this case, fluctuation of the thermal capacity in terms of the heater can be suppressed more.

Next, the second reason for allowing formation of the solder bumps with the liquid solder composition will be described in detail.

The liquid solder composition is made of a mixture of the solder particles and a liquid material (base agent) with a flux effect, which has a characteristic that it becomes liquid at a normal temperature or while heated. That is, the solder composition is liquid at a normal temperature or becomes liquid while heated. In order to attain such characteristic (flow characteristic), it is necessary for the liquid material to have low viscosity, the mixing ratio of the solder particles to be small, and the grain diameter of the solder particle to be small. While heated, the solder particles float or precipitate in the liquid material. A conventional solder paste is included in the solder composition as long as it can be in a liquid state while heated.

In the reflow step of the present invention, the solder composition is heated from the substrate side. When the solder composition on the substrate is heated from the substrate side, the temperature of the solder composition becomes lower towards the top-face side and becomes higher towards the substrate side. Thus, the lower solder particles near the pad electrodes start to melt first and, when melted, they are wet and spread over the pad electrodes. At that time, the upper solder particles far from the pad electrodes have not sufficiently been melted yet. Thus, it is possible to reduce the risk of uniting the solder particles with each other, thereby suppressing generation of solder bridges as well.

Further, in the reflow step, first, the pad electrodes may be heated to a melting point of the solder particles or higher for melting the solder particles that are in contact with the pad electrodes so as to form a solder coating wet and spread over the pad electrodes. Moreover, the solder particles may be united with the solder coating. Such heating state can be achieved by controlling the temperature profile and the temperature distribution. For example, it is effective to heat the solder composition on the substrate from the substrate side and, at the same time, control the temperature of the solder composition form the top-face side.

Furthermore, in the reflow step, the solder particles closer to the substrate side may be precipitated first by providing a temperature difference such that the substrate side is higher than the top-face side thereof. By providing such temperature difference that the top-face side of the solder composition is lower and the substrate side is higher, the lower solder particles near the pad electrode precipitate and start to melt first, and are wet and spread when coming in contact with the pad electrode, since the viscosity of the liquid material deteriorates more as the temperature becomes higher. In that state, the upper solder particles far from the pad electrode have not sufficiently been precipitated and melted yet. Thus, the risk of uniting the solder particles with each other can be more reduced, so that generation of the solder bridges can also be suppressed more. Further, such heating state can be achieved by controlling the relation between the temperature dependency of the viscosity of the liquid material and the melting point of the solder particles, in addition to controlling the temperature profile and the temperature distribution.

The heater according to the present invention comprises: the mount plate on which the substrate or the like is loaded; the opening formed on the mount plate, which is covered by placing the substrate or the like; and the hot-air generating unit for applying heat by blowing hot air to the bottom of the substrate or the like through the opening. Thus, the hot air is simply blown to the bottom side of the substrate or the like at the opening and not blown out from the opening. Therefore, it is possible to prevent the hot air from moving around to the above the substrate. As a result, oxidation of the solder paste or the like on the substrate can be suppressed even when the substrate or the like is heated using the hot air. In addition, even though it applies heat using the hot air, the solder bumps can be formed with liquid solder composition. The reason for this is that it is possible to prevent the hot air from moving around to the above the substrate, so that the solder composition is not oxidized or the temperature distribution of the solder composition becomes lower on the top-face side and higher on the substrate side.

Further, by providing the hot-air circulation path for returning the hot air blown to the bottom side of the substrate or the like again to the heating device, the hot air moving around towards the above the substrate can be reduced. In addition, heat can be efficiently utilized so that the energy can be saved.

Furthermore, by providing the thermostat device for controlling the temperature of the substrate, it becomes possible to regulate the temperature of the substrate. Thus, the formation state of the solder bumps can be easily controlled Moreover, oxidation of the solder surface can be suppressed more.

Further, by proving the holding mechanism for securing the substrate or the like to the mount plate, it is possible to prevent the substrate or the like from being blown out or shifted off therefrom by the hot air.

Furthermore, by using the container that holds the substrate while immersing it in the liquid solder composition, heat can be applied by filling also the gaps between the substrate and the container with the liquid solder composition. Thus, thermal conduction from the container to the substrate can be made uniform. Therefore, a large number of solder bumps can be formed simultaneously under the same condition, so that variations in the solder bumps in manufacture can be reduced. In addition, by controlling the amount of the solder composition to be placed on the substrate, the size (height) of the solder bumps can be changed.

The reflow apparatus according to the present invention uses the heater of the present invention for the preliminary heating section and the reflow section. Thereby, oxidation of the solder paste or the like on the substrate can be suppressed. In addition, even though it applies heat using the hot air, the solder bumps can be formed with the liquid solder composition.

Furthermore, by providing the preliminary heating section, the reflow section, and the cooling section, transport processing of the substrate or the like becomes easy and the overall structure becomes simple and small-sized as well.

Moreover, by stopping the action of the hot-air generating unit when the opening is not covered by the substrate or the like, blow-out of the hot air from the opening can be suppressed.

In the method of using the reflow apparatus according to the present invention, a dummy substrate or the like is fed before, after, or in the middle of a plurality of the substrates or the like, thereby suppressing blow-out of the hot air from the opening when the opening is not covered by the substrate or the like. Moreover, fluctuation of the thermal capacity in terms of the heater is reduced so that fluctuation in the temperature of the hot air can be suppressed.

BRIEF DESCRIPTION OF THE DRAWINGS

FIG. 3 Cross sections for showing an example of the solder bump forming method (a dropping step) using the heater of FIG. 1, in which the step proceeds in order of FIG. 3-FIG. 3

FIG. 4 Cross sections for showing an example of the solder bump forming method (a reflow step) using the heater of FIG. 1, in which the step proceeds in order of FIG. 4-FIG. 4;

FIG. 5 Illustrations for showing a second embodiment of the heater according to the present invention, in which FIG. 5 is a fragmentary plan view and FIG. 5 is a cross section taken along the line V-V of FIG. 5;

FIG. 12 Cross sections for showing the first embodiment of the solder bump forming method (a dropping step) according to the present invention, in which the step proceeds in order of FIG. 12-FIG. 12;

FIG. 13 Cross sections for showing the first embodiment of the solder bump forming method (a reflow step) according to the present invention, in which the step proceeds in order of FIG. 13-FIG. 13;

BEST MODE FOR CARRYING OUT THE INVENTION

Next, embodiments of the present invention will be described by referring to the accompanying drawings.

Figure 1:
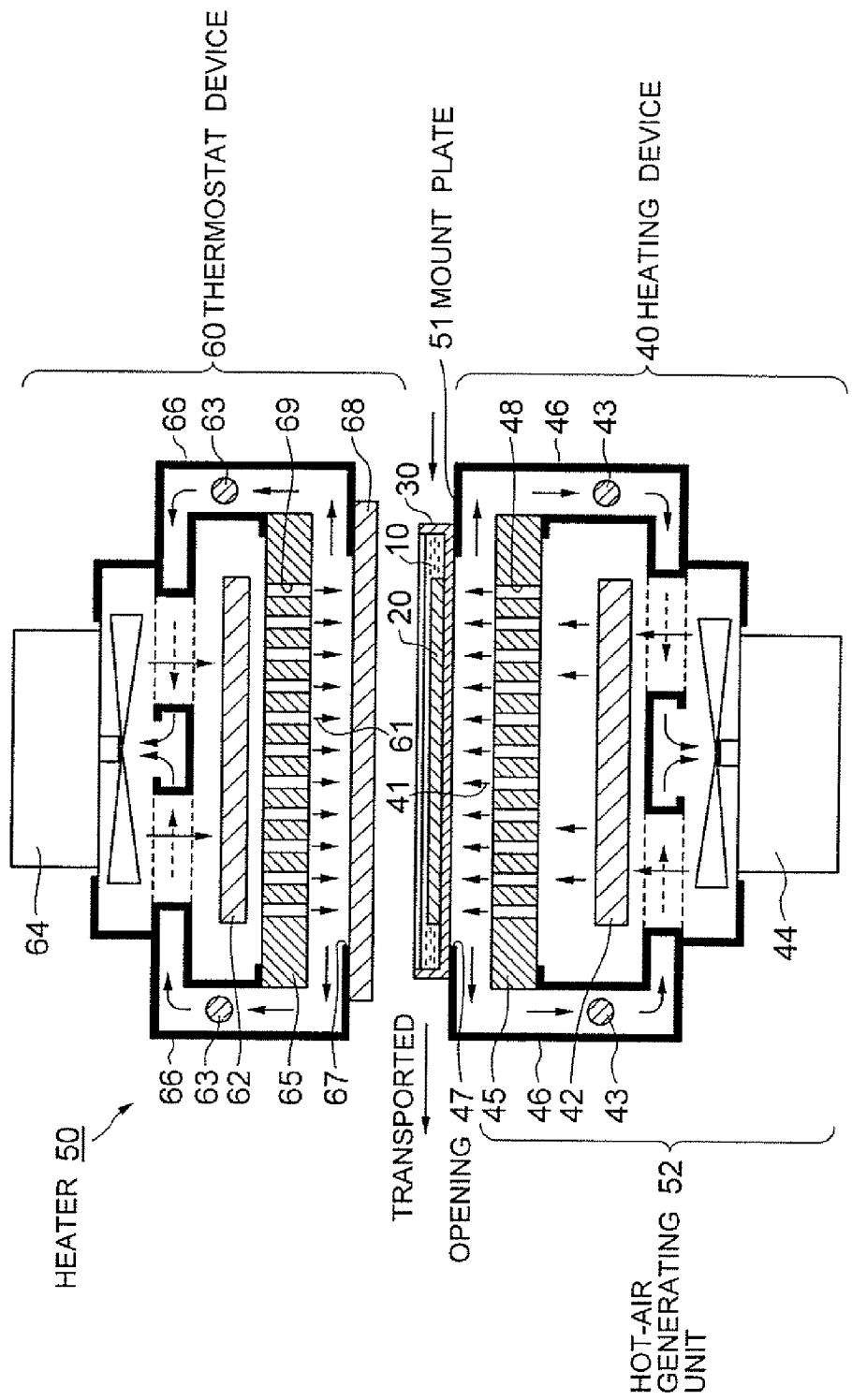
FIG. 1 A schematic cross section for showing a first embodiment of a heater according to the present invention.

As shown in FIG. 1, a heater 50 according to a first embodiment of the present invention is used for heating a solder composition 10 on a substrate 20. As shown in FIG. 1, the heater 50 comprises a heating device 40 for heating the solder composition 10 from the substrate 20 side. The substrate 20 to be heated by the heating device 40 is immersed in the liquid solder composition 10 within a container 30.

The heating device 40 is constituted with a main heating source 42, a sub-heating source 43, a blower 44, a heat storage member 45, a hot-air circulation duct 46, an opening 47, etc. The opening 47 is an aperture formed for blowing hot air 41 to the container 30. For example, an electric heater is used as the main heating source 42 and the sub-heating source 43. The heat storage member 45 is made of an aluminum material, for example, on which a great number of transparent holes 48 are formed for letting through the hot air 41. The hot air 41 is circulated by the blower 44. That is, the hot air 41 circulates through the circulation path from the main heating source 42→the heat storage member 45→the opening 47 (the bottom part of the container 30)→the circulation duct 46→the sub-heating source 43→the hot-air circulation duct 46→the blower 44→the main heating source 42. The heating device 40 is capable of heating the entire substrate 20 more uniformly compared to those utilizing the thermal conduction because it applies heat by blowing the hot air 41 to the container 30.

Further, the hot-air circulation duct 46 has a mount plate 51 for supporting the container 30 at an area surrounding the opening 47. A hot-air generating unit 52 is constituted with the heating device 40 except the mount plate 51 and the opening 47. When the container 30 is placed on the mount plate 51, the opening 47 is covered by the bottom part of the container 30, thereby closing the opening 47. The hot-air generating unit 52 blows the hot air 41 to the bottom part of the container 30 from the opening 47.

The heater 50 shown in FIG. 1 may be provided, when necessary, with a thermostat device 60 for controlling the temperatures of the substrate 20 from the top-face side. The thermostat device 60 shown in FIG. 1 is constituted with a main thermostat source 62, a sub-thermostat source 63, a blower 64, a cool storage (or heat storage) member 65, a circulation duct 66, an opening 67, a heat absorbing plate (or radiation plate) 6S, etc. The cool storage member 65 is made of an aluminum material, for example, on which a great number of transparent holes 69 are formed for letting through a thermostat medium 61. It is desirable that the heat absorbing plate 68 be made of an aluminum material, for example, and the solder composition 10 side be in a state close to a black body. The thermostat medium 61 is circulated by the blower 64. That is, the thermostat medium 61 circulates through the circulation path from the main thermostat source 62→the cool storage member 65→the opening 67 (cool the heat absorbing plate 68)→the circulation duct 66→the sub-thermostat source 63→the circulation duct 66→the blower 64→the main thermostat source 62. The thermostat medium 61 may be anything as long as it has a temperature capable of controlling the temperature of the surface of the solder composition 10. The heat absorbing plate 68 has a function of absorbing the heat of the substrate 20, and the structures of the thermostat device 60 other than the heat absorbing plate 68 constitutes an endothermic section that can continuously allow the heat absorbing plate 68 to exhibit the heat absorbing function by absorbing the heat of the heat absorbing plate 68. In that case, the main thermostat source 62 and the sub-thermostat source 63 work as functions for cooling the thermostat medium 61. In the description provided above, the thermostat device 60 has been described as the structure for providing a temperature difference between the top-face side and the substrate side of the solder composition by depriving the heat of the substrate 20. However, it is not intended to be limited to this. That is, the thermostat device 60 may be structured to heat the substrate 20 by radiant heat. In that case, the heat absorbing plate 68 functions as a radiation plate for heating the substrate 20 by the radiant heat, and the structures other than the radiation plate 68 constitute a heating section that can continuously allow the radiation plate 68 to exhibit the heating function by heating the radiation plate 68. In this structure, the main thermostat source 62 and the sub-thermostat source 63 work as functions for heating the thermostat medium 61. When heating the substrate 20 by the thermostat device 60, the heating temperature may be set as same as the temperature heated by the heating device 40 or higher. The thermostat device 60 in both cases employs the system where the cool air or hot air of the thermostat medium 61 does not directly come in contact with the solder composition 10 on the substrate 20. Thus, there is no bad influence to be imposed on the solder composition 10 deposited in layers.

Next, action of the heater 50 will be described. In general, when using the heater 50, it is used for heating the solder composition 10 on the substrate 20 with the heating device 40. That is, the substrate 20 is immersed within the solder composition 10 filled into the container 30. Then, the container 30 is placed on the mount plate 51 for closing the opening 47 by the bottom part of the container 30, thereby forming the circulation path of the hot air 41. When the hot air 41 is generated by the heating device 40, it circulates through the circulation path. The bottom part of the container 30 is heated by the circulating hot air 41, and the substrate 20 is heated by that heat. Since the hot air 41 does not move around towards the above the container 30, oxidation of the solder composite 10 on the substrate 20 can be suppressed.

However, since the heat by the heating device 40 does not move around towards the solder composition 10 side, there is a temperature difference generated with respect to the substrate 20 side. When relatively comparing the temperature of the substrate 20 side and that of the solder composition 10 side, there is generated a state where the temperature of the substrate 20 side becomes higher and that of the solder composition 10 side is lower. This means to control fusion of the solder particles 11 contained in the solder composition 10 as will be described alter. That is, the solder particles 11 mixed in a liquid body 12 of the solder composition 10 precipitate in the liquid body 12, which are soldered to the electrodes of the substrate 20. When the temperature of the solder composition 10 side is low, coalescence of the solder particles 11 precipitating in the liquid body 12 can be suppressed. Because the temperature of the substrate 20 side is high, the solder particles 11 are actively melted, so that soldering of the solder particles 11 to the electrodes of the substrate 20 can be accelerated.

In the above, there has been described by referring to the case where the thermostat device 60 is not used for the heater 50. However, the thermostat device 60 may be used as well. That is, the above-described case uses only the heating device 40 so that the thermoregulation of the solder composition 10 side cannot be achieved. However, the use of the thermostat device 60 enables the temperature control of the solder composition 10 side. With this, coalescence of the solder particles 11 precipitating in the liquid body 12 can be suppressed and soldering can be securely performed on the electrodes of the substrate 20.

Figure 2:
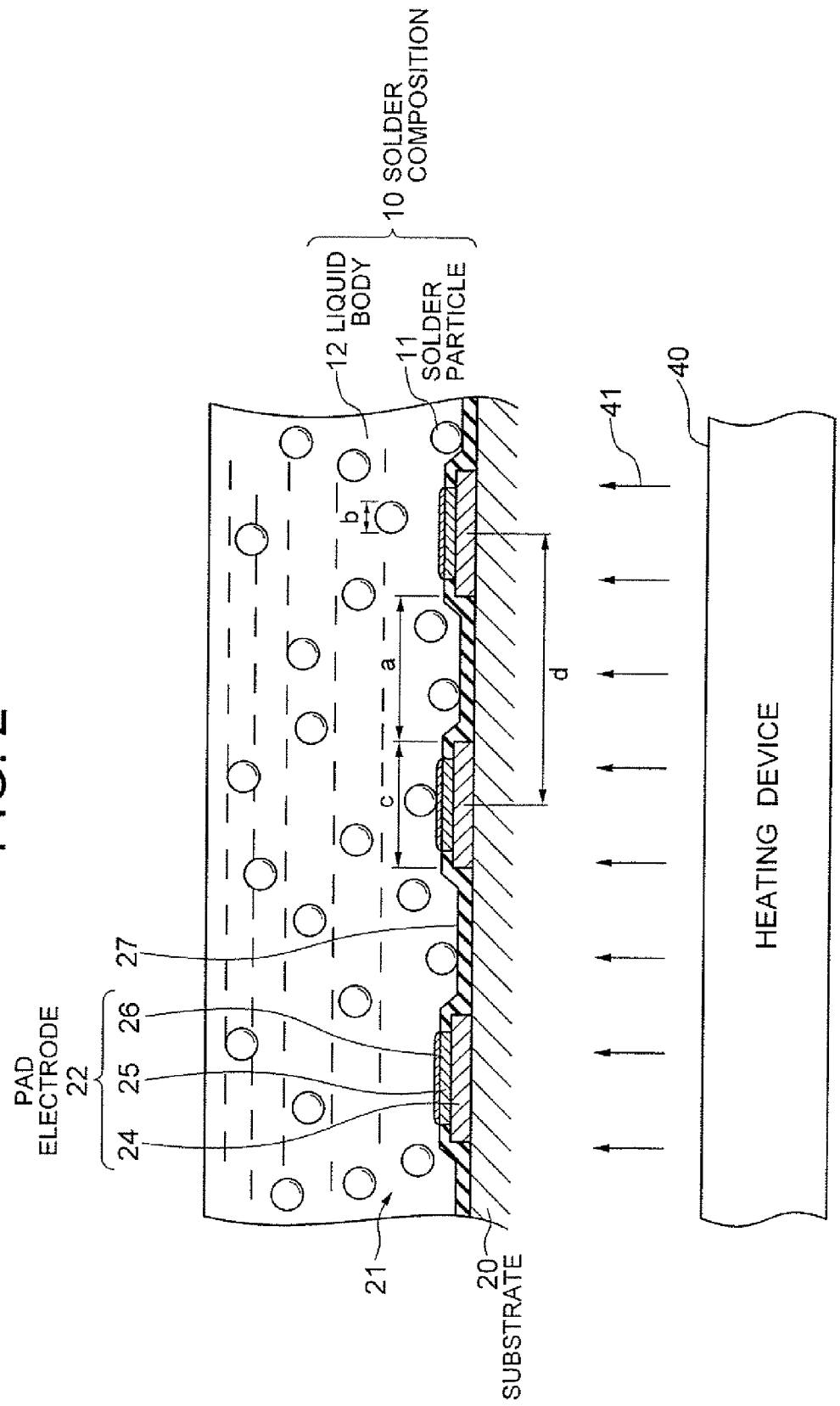
FIG. 2 A cross section for showing an example of a solder bump forming method using the heater of FIG. 1.

Next, there is described a method for forming the solder bumps with a liquid solder composition using the heater of this embodiment. FIG. 2 is a cross section for showing an example of the solder bump forming method using the heater of FIG. 1. Description will be provided hereinafter by referring to this illustration. However, the same reference numerals are applied to the components that are same as those of FIG. 1, and the descriptions thereof are omitted. FIG. 1 shows the state where the solder composition is applied on the substrate, in which the vertical view thereof is enlarged compared to that of the lateral view.

The solder composition 10 used in this embodiment is a mixture of a great number of solder particles 11 and the liquid body 12 made of fatty ester, which is used for forming the solder bumps on the pad electrodes 22. The liquid body 12 has such a viscosity that it spreads in a uniform thickness by the weight of itself when dropped on the substrate 20 at a normal temperature and exhibits a flux effect that causes solder wet on the pad electrodes 22 by the solder particles 11 when heated to the melting point of the solder particles 11 or higher. The solder particles 11 have such a mixing ratio and a particle diameter that they are spread and dispersed together with the liquid body 12 when dropped on the substrate 20 with the liquid body 12.

Further, the solder particles 11 have only a natural oxide film (not shown) on the surfaces. The liquid body 12 is fatty ester so that it originally contains free fatty acid that is a kind of organic acid. The free fatty acid accelerates the soldering between the solder particles 11 and the pad electrodes 22, while suppressing coalescence of the solder particles 11 when heated to the melting point of the solder particle 11 or higher. At the same time, it exhibits an effect of accelerating coalescence of the solder coating formed on the pad electrodes 22 and the solder particles 11.

The organic acid contained in the liquid body 12 may be added as necessary. That is, the content of the organic acid in the liquid body 12 is controlled in accordance with the degree of oxidation and the amount of the solder particles 11. For example, there is required a large amount of the solder particles 11 when forming a large number of solder bumps. Thus, it is necessary to contain sufficient organic acid for deoxidizing the oxide film of all the solder particles 11. In the meantime, when there is added an excessive amount of solder particles 11 that is more than the amount used for forming the bumps, the content of the organic acid is reduced for decreasing the activating power of the liquid body 12 so that the fine solder particles 11 in terms of the particle size distribution of the solder powder are not melted. With this, it is possible to form the optimum bumps with only the relatively larger solder particles 11. The fine solder particles that are not melted and remained at this time have an effect of decreasing short-circuit of the pad electrodes 22 by preventing coalescence of the solder particles 11.

It is necessary for the solder particles 11 to be uniformly dispersed in the liquid body 12, so that it is desirable for the solder composition 10 to be stirred right before the use. For a material of the solder particles 11, there is used tin-lead type solder, lead-free solder, or the like. It is preferable for the diameter b of the solder particle 11 to be smaller than the shortest distance a between the peripheral ends of the adjacent pad electrodes 22.

The solder composition 10 is dropped on the substrate 20 having the pad electrodes 22 by natural fall at a normal temperature. Only with this, the solder composition 10 with a uniform thickness can be applied over the substrate 20. That is, it is possible to form a coating film of the solder composition 10 with a uniform thickness on the substrate 20 without using screen printing and a dispenser. The uniformity of the coating influences the dispersions in the solder bumps, so that it should be applied uniformly as much as possible. Then, the entire substrate 20 is heated uniformly for allowing formation of the solder bumps. The heating temperature is increased to the melting point of the solder or higher in a short time.

Through increasing the temperature in a short time, deterioration in the activating force of organic acid during the process can be suppressed.

Next, the substrate 20 used in this embodiment will be described. The substrate 20 is a silicon wafer. The pad electrodes 22 are formed on a top-face 21 of the substrate 20. The solder bumps are formed on the pad electrodes 22 by the forming method of the embodiment. The substrate 20 is connected electrically and mechanically to another semiconductor chip or wiring board through the solder bumps. The shape of the pad electrode 22 is circular, for example, having the diameter c of 40 μm, for example. The distance d between the centers of the adjacent pad electrodes 22 is 80 μm, for example. The diameter b of the solder particle 11 is 3-15 μm, for example.

The pad electrode 22 is constituted with an aluminum electrode 24 formed on the substrate 20, a nickel layer formed on the aluminum electrode 24, and a metal layer 26 formed on the nickel layer 25. The nickel layer 25 and the metal layer 26 are UBM (under barrier metal or under bump metallurgy) layers The part on the substrate 20 other than the pad electrodes 22 is covered by a protection film 27.

Next, a forming method of the pad electrodes 22 will be described. First, the aluminum electrode 24 is formed on the substrate 20, and the protection film 27 is formed with a polyimide resin or silicon nitride film over the part except for the aluminum electrode 24. These are formed by using photolithography and etching, for example. After applying zincate treatment on the surface of the aluminum electrode 24, the nickel layer 25 and the metal layer 26 are formed on the aluminum electrode 24 by electroless plating. The UBM layers are provided for supplying the solder wettability to the aluminum electrode 24.

For the material of the solder particles 11, there are used Sn—Pb (melting point at 183° C.), Sn—Ag—Cu (melting point at 218° C.), Sn—Ag (melting point at 221° C.), Sn—Cu (melting point at 227° C.), or lead-free solders and the like.

As described above, the heating device 40 is constituted with the blower, electric heater, etc., and it heats the solder composition 10 by blowing the hot air 41 from the substrate 20 side (from the bottom side).

FIG. 3 and FIG. 4 are cross sections for showing an example of the solder bump forming method using the heater of FIG. 1. FIG. 3 illustrates the dropping step, which proceeds in order of FIG. 3-FIG. 3. FIG. 4 illustrates the reflow step, which proceeds in order of FIG. 4-FIG. 4. Description will be provided hereinafter by referring to those illustrations. However, the same reference numerals are applied to the components that are same as those of FIG. 2, and the descriptions thereof are omitted. For describing FIG. 3, the above-described "container 30" is referred to as "receiver container 30".

In FIG. 3, illustrations of the pad electrodes 22 on the substrate 20 are omitted. First, as shown in FIG. 3, the substrate 20 is placed in the receiver container 30. Then, after stirring the solder composition 10 in a pouring container 31 as necessary, the solder composition 10 is dropped from a pourer 32 on the substrate 20. Upon this, the solder composition 10 spreads into a uniform thickness by the weight of itself. At this time, the temperature may be at a normal temperature. Moreover, natural fall of the solder composition 10 can be utilized. A printing machine or discharge device may be used for applying the solder composition 10 on the substrate 20.

The receiver container 30 is heated along with the substrate 20 in the reflow step. Thus, it is made of a metal such as aluminum that exhibits heat resistance and fine thermal conduction, and causes no solder wet by the solder particles 11.

Further, the receiver container 30 has a flat bottom face 33 for placing a flat-plate-type substrate 20, and a surrounding wall 34 for preventing the lateral overflow of the solder composition 10. In this case, the substrate 20 comes in contact closely with the bottom face 33 of the receiver container 30, thereby improving the thermal conduction. In FIG. 2 and FIG. 4, illustration of the receiver container 30 is omitted.

Furthermore, during or after the dropping step, the substrate 20 may be rotated horizontally so that the thickness of the solder composition 10 on the substrate 20 becomes uniform. For rotating the substrate 20 horizontally, a spin-coating device available on the market may be used.

End of the dropping step can be classified into two types depending on whether or not the solder composition 10 is dropped until the substrate 20 is immersed in the solder composition 10. FIG. 3 shows the case where the substrate 20 is not immersed in the solder composition 10. In this case, thickness t1 of the solder composition 10 on the substrate 20 is a value determined in accordance mainly with the surface tension and the viscosity of the solder composition 10. In the meantime, FIG. 3 shows the case where the substrate 20 is immersed in the solder composition 10. In this case, thickness t2 of the solder composition 10 on the substrate 20 can be set as a desired value in accordance with the amount of the solder composition 10 to be dropped.

Through the above-described dropping step, the solder composition 10 is applied solid over the substrate 20 on which a plurality of pad electrodes 22 are provided with a space therebetween as shown in FIG. 2. At this time, the solder composition 10 is applied all over the face including the plurality of the pad electrodes 22 and the protection film 27 formed between the gaps thereof. The solder composition 10 is in a state just like an ink.

Then, when heating of the substrate 20 and the solder composition 10 is started in the reflow step, the viscosity of the liquid body 12 is deteriorated further. With this, as shown in FIG. 4, the solder particles 11 precipitate and pile up over the pad electrodes 22 and the protection film 27, since the specific gravity of the solder particles 11 is larger than that of the liquid body 12.

Subsequently, as shown in FIG. 4, the solder composition 10 is heated up to the melting point of the solder particles 11 or higher. The solder composition 10 on the substrate 20 is heated from the substrate 20 side, so that the temperature of the solder composition 10 is lower towards the top-face side and becomes higher towards the substrate 20 side. Thus, the lower solder particles 11 near the pad electrode 22 starts to melt first and, when melted, they are wet and spread over the pad electrode 22. At that time, the upper solder particles 11 far from the pad electrode 22 has not sufficiently been melted yet. Thus, it is possible to reduce the risk of uniting the solder particles 11 with each other, thereby suppressing generation of solder bridges as well. In other words, in the reflow step, first, the pad electrode 22 is heated up to the melting point of the solder particles 11 or higher for melting the solder particles that are in contact with the pad electrode 22 so as to form a coating 23' wet and spread over the pad electrode 22. Further, the solder particles 11 are united with the solder coating 23'.

At this time, due to the effect of the organic acid contained in the liquid body 12, there is induced a following state. First, coalescence of the solder particles 11 can be suppressed. Although not shown in FIG. 4, however, part of the solder particles 11 are united with each other and become larger. In other words, it is not an issue even though the solder particles 11 are united with each other as long as it is in a specific size or smaller. In the meantime, the solder particles 11 spread over the pad electrode 22 and form an alloy layer on the interface. As a result, the solder coating 23' is formed on the pad electrode 22, and the solder particles 11 are united further with the solder coating 23'. That is, the solder coating 23' grows into a solder bump 23 as shown in FIG. 4.

In FIG. 4, the solder particles 11 that are not used for forming the solder bumps 23 are washed off along with the remaining liquid body 12 in a latter step.

Further, in the reflow step, the solder particles 11 closer to the substrate 20 side may precipitate first by providing such a temperature difference in the solder composition 10 that the top-face side thereof is lower and the substrate 20 side is higher. By providing such temperature difference that the top-face side of the solder composition 10 is lower and the substrate 20 side is higher, the lower solder particles 11 near the pad electrode 22 precipitate and start to melt first, and become wet and spread when coming in contact with the pad electrode 22, since the viscosity deteriorates more as the temperature of the liquid body 12 becomes higher. In that state, the upper solder particles 11 far from the pad electrode 22 have not sufficiently precipitated and melted yet. Thus, the risk of uniting the solder particles 11 with each other can be more reduced, so that generation of the solder bridges can also be suppressed more. Further, such heating state can be achieved by, for example, heating the solder composition 10 on the substrate 20 from the substrate 20 side while controlling the temperature of the solder composition 10 from the top-face side, and controlling the relation between the temperature dependency of the viscosity of the liquid body 12 and the melting point of the solder particles 11, etc.

Furthermore, in the reflow step, the solder particles 11 may be supplied to the pad electrode 22 by utilizing convection of the liquid body 12. When the solder composition 10 is heated from the substrate 20 side, convection is generated in the liquid body 12 so that the solder particles 11 move within the liquid body 12. Thus, the solder particles 11 that are not placed on the pad electrode 22 are shifted on the pad electrode 22 to be a part of the solder bump 23. Thereby, the solder particles 11 can be utilized efficiently.

In the above, there has been described by referring to the case where the cooling function of the thermostat device 60 is utilized for the solder composition for forming the solder bumps. However, it is not intended to be limited to this. The solder bumps may be formed by utilizing the heating function of the thermostat device 60 for the solder composition. Furthermore, the solder bumps may be formed by switching the cooling function and heating function of the thermostat device 60.

FIG. 5 shows a second embodiment of the heater according to the present invention. FIG. 5 is a fragmentary plan view and FIG. 5 is a cross section taken along the line V-V of FIG. 5. Description will be provided hereinafter by referring to these illustrations. However, the components that are the same as those of FIG. 1 either have the same reference numerals applied thereto or not illustrated therein, and the description thereof are omitted.

In the embodiment, there is provided a holding mechanism 55 for securing the substrate 20 on the mount plate 51. The holding mechanism 55 is constituted with plunger-type solenoids 56a, 56b, top-type holding cams 57a, 57b, etc. One end 561 of the solenoid 56a is rotatably mounted to the mount plate 51, and the other end 562 is mounted rotatably to the vicinity of the outer periphery of the holding cam 57a. The holding cam 57a is rotatably mounted to the mount plate 51 through the center shaft 571. The solenoid 56b and the holding cum 57b have the same structures as those described.

In the illustration, the solenoids 56a and 56b are in a contracted state, and the holding cams 57a and 57b are rotated to an angle for holding the substrate 20. When the solenoids 56a and 56b are stretched as shown by arrows in the illustration, the holding cams 57a and 57b rotate to an angle for releasing the substrate 20.

The substrate 20 may be blown off or shifted off by the hot air 41 depending of the weight of the substrate 20 or the pressure of the hot air 41. In such a case, the holding mechanism 55 is provided for securing the substrate 20. The holding mechanism 55 holds the substrate 20 in this embodiment, however, it is needles to say that the mechanism holds the container 30 (FIG. 1).

Figure 6:
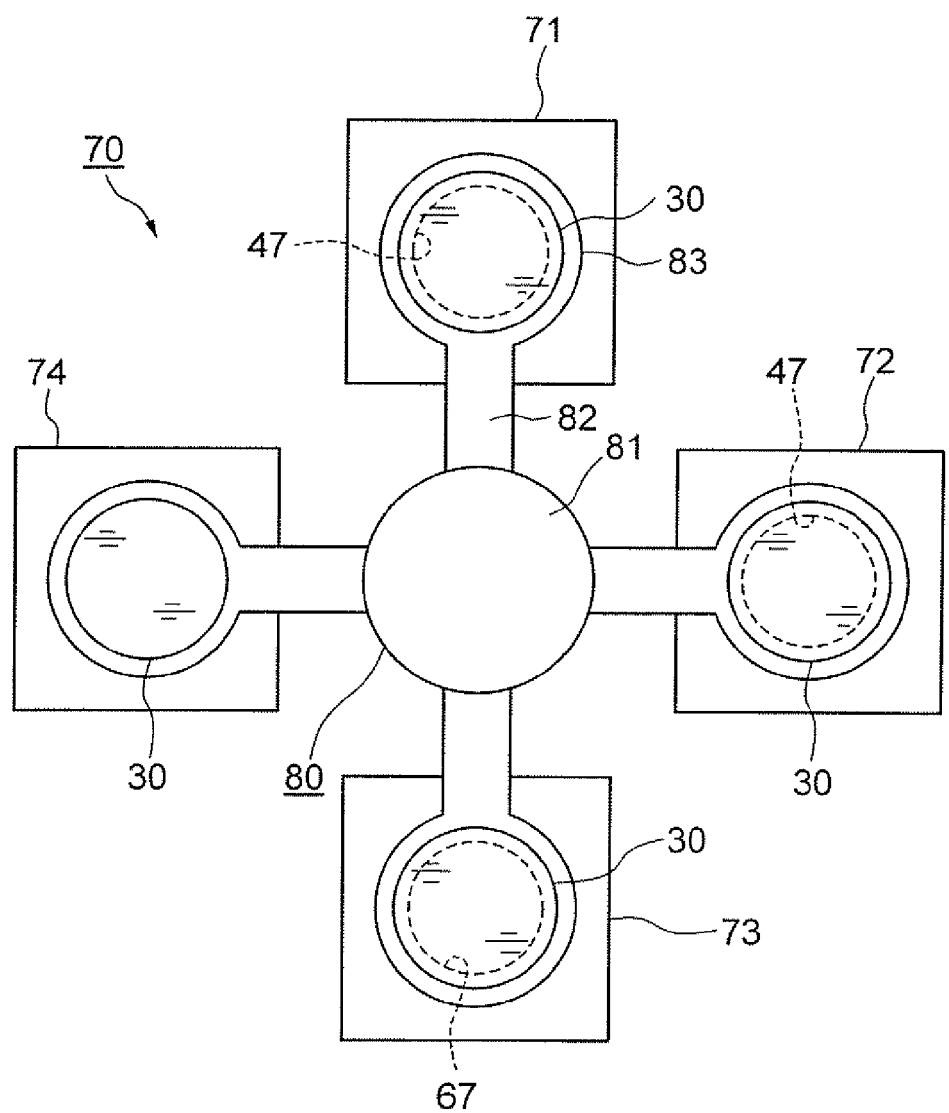
FIG. 6 A plan view for showing the first embodiment of a reflow apparatus according to the present invention (while heating)
Figure 7:
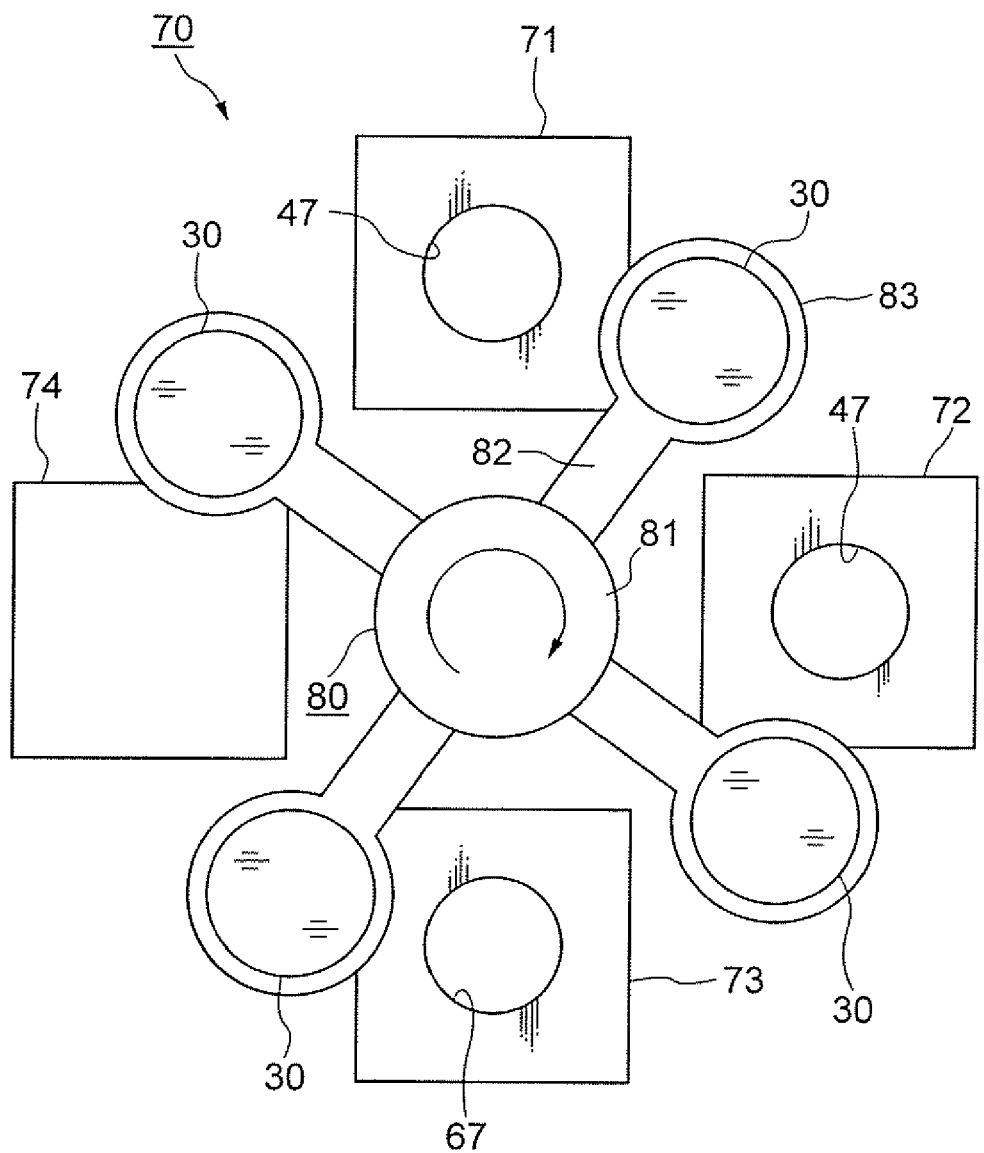
FIG. 7 A plan view for showing the first embodiment of the reflow apparatus according to the present invention (during transportation)

Next, there is described a case where the heater according to the embodiment of the present invention is applied to a reflow apparatus by referring to FIG. 6 and FIG. 7. FIG. 6 and FIG. 7 are plan views for showing an embodiment of the reflow apparatus according to the present invention, in which FIG. 6 shows the state while heated and FIG. 7 shows the state during transportation. Description will be provided hereinafter by referring to those illustrations. However, the same reference numerals are applied to the components that are same as those of FIG. 1, and the descriptions thereof are omitted.

A reflow apparatus 70 of this embodiment comprises a preliminary heating section 71, a reflow section 72, and a cooling section 73 arranged on a concentric circle in this order, and a transporting mechanism 80 for transporting the container 30 in this order. Further, an entrance/exit part 74 is provided between the preliminary heating section 71 and the cooling section 73. The above-described heater 50 is used for the preliminary heating section 71 and the reflow section 72. The reflow apparatus 70 shown in FIG. 8 employs the heater 50 with no thermostat device 60, however, it is not limited to this. The heater 50 comprising the thermostat device 60 shown in FIG. 1 may be used for the preliminary heating section 71 and the reflow section 72. For the cooling section 73, the structure of the heating device 40 of the heater 50 as shown in FIG. 1 is applied. In this case, a cooling medium 61 is used instead of the medium 61 supplied by the heating device 40. The cooling medium 61 is let through an opening 67 and applied from the bottom side of the container 30 for annealing the substrate.

Figure 8:
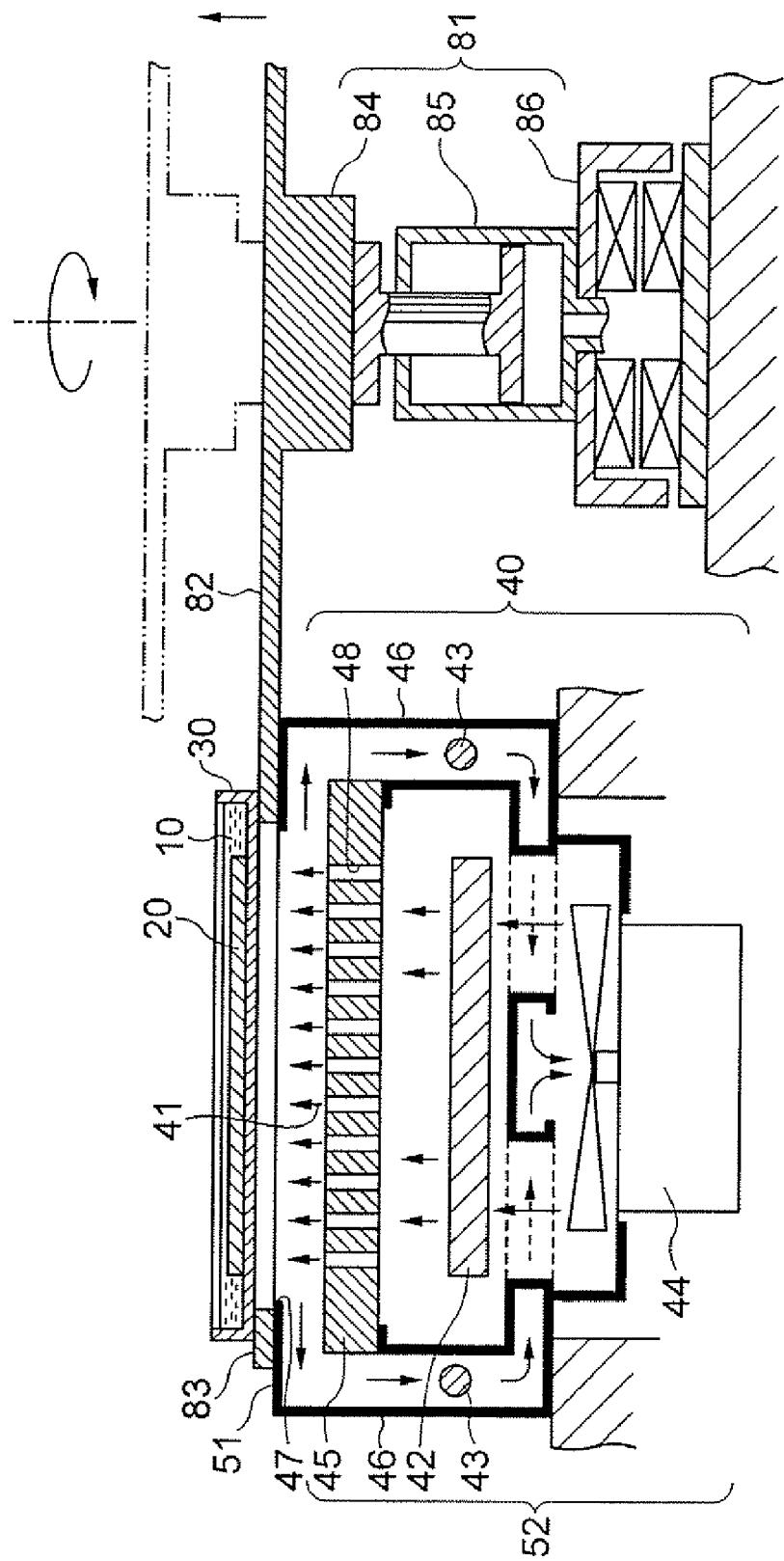
FIG. 8 A schematic cross section for showing the entire part of a transporting mechanism of the reflow apparatus shown in FIG. 5.
Figure 9:
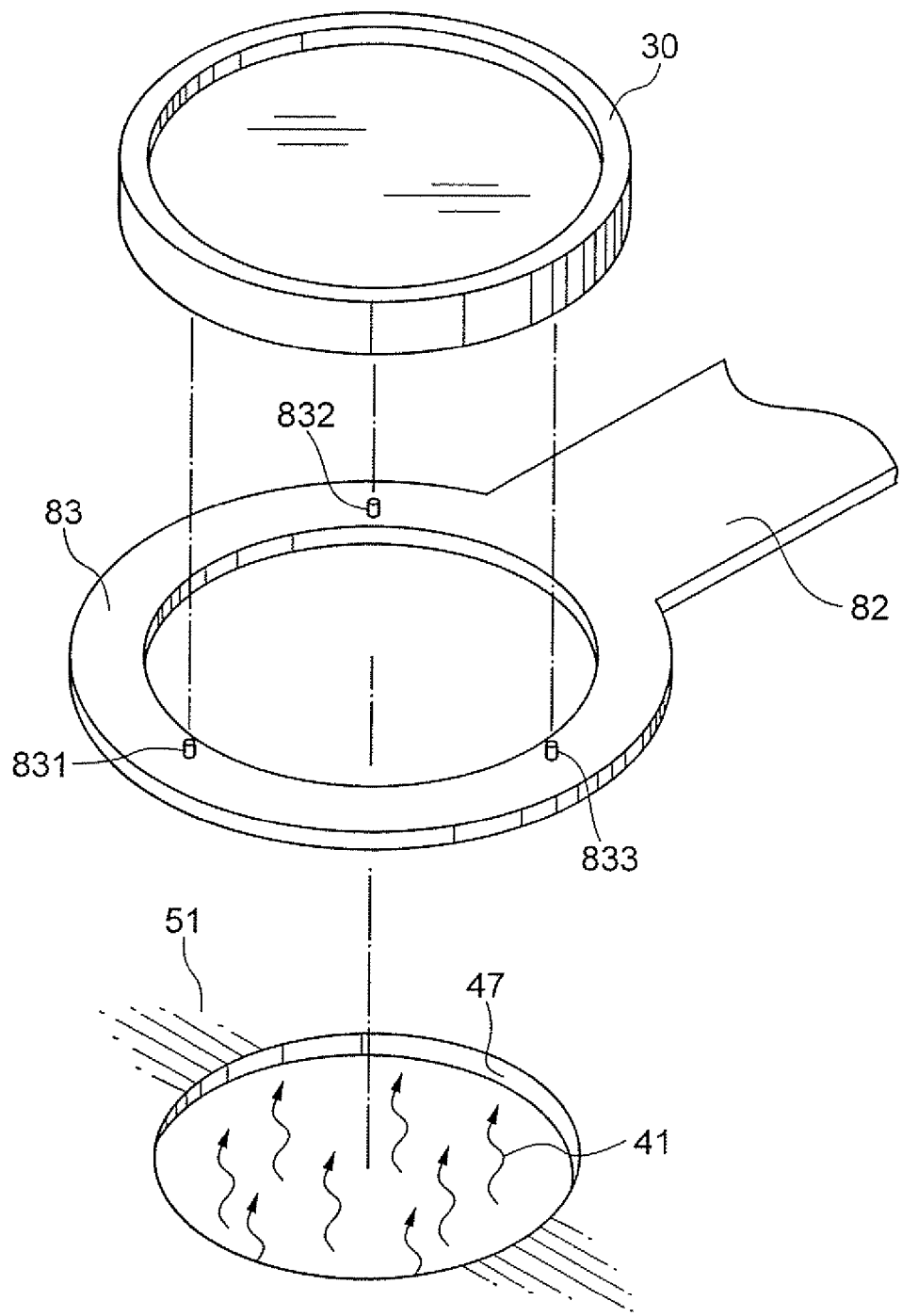
FIG. 9 A perspective view for showing a container holder of the transporting mechanism of the reflow apparatus shown in FIG. 5.

FIG. 8 and FIG. 9 show the transporting mechanism of the reflow apparatus of FIG. 6. FIG. 8 is a schematic cross section of the entire mechanism and FIG. 9 is a perspective view of a container holder. Description will be provided hereinafter by referring to FIG. 6 FIG. 9. However, in FIG. 8 and FIG. 9, the same reference numerals are applied to the components that are same as those of FIG. 1, and the descriptions thereof are omitted.

As shown in FIG. 8, the transporting mechanism 80 is constituted with a driving unit 81 in the center, four arms 82 attached to the driving section 81, and the container holders 83 formed at the tips of the arms 82. The driving unit 81 is constituted with a center plate 84 for supporting the four arms 82, an air cylinder 85 for moving the center plate 84 vertically, and a ring motor 86 for rotating both the center plate 84 and the air cylinder 85.

As shown in FIG. 9, the container holder 83 has a ring shape and comprises three protruded parts 831-833 formed on the upper face. The protruded parts 831-833 are engaged with recessed parts (not shown) formed on the bottom face of the container 30. Through engaging the protruded parts 831-833 with the recessed parts, the container 30 can be secured to the container holder 83 detachably.

Figure 10:
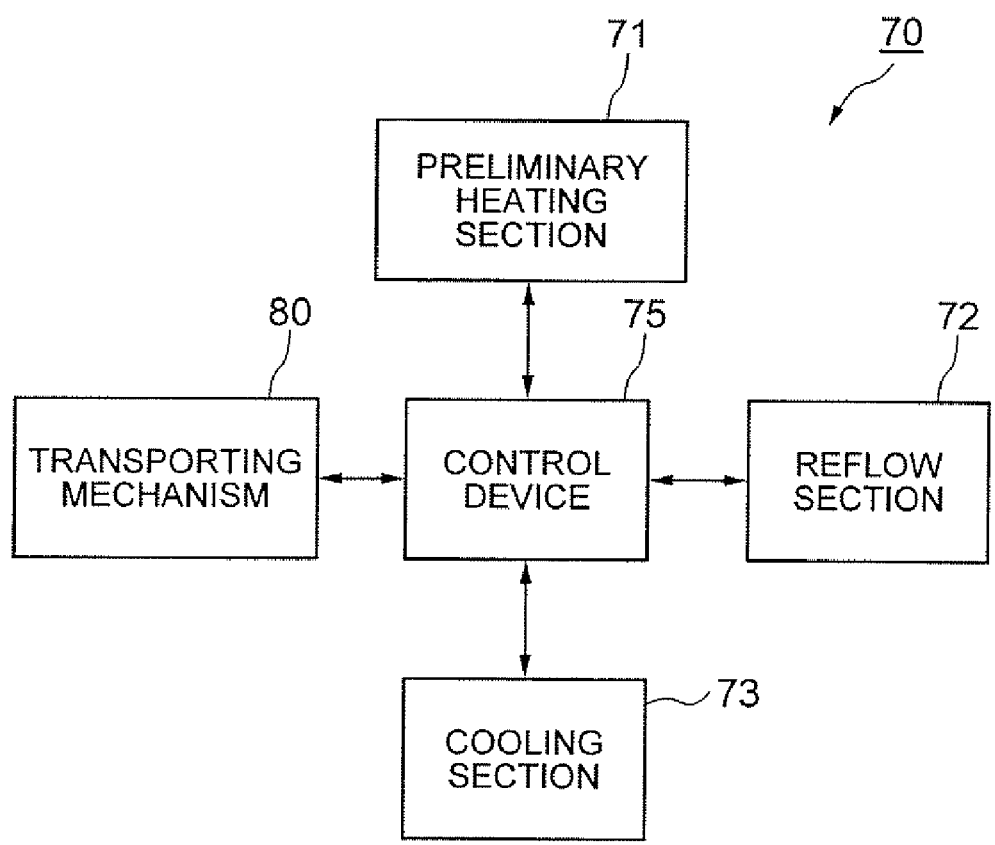
FIG. 10 A block diagram for showing a control system of the reflow apparatus shown in FIG. 5.

FIG. 10 is a block diagram for showing the control system of the reflow apparatus shown in FIG. 6. Description will be provided hereinafter by referring to this illustration. However, the same reference numerals are applied to the components that are same as those of FIG. 6, and the descriptions thereof are omitted.

The reflow apparatus 70 further comprises a control device 75 for controlling the respective actions of the preliminary heating section 71, reflow section 72, cooling section 73, and the transporting mechanism 80. The control device 75 is constituted with a microcomputer and a program thereof, for example. The control targets of the control device 75 are temperatures and air flow amount of the preliminary heating section 71, the reflow section 72, and the cooling section 73, the transporting action of the transporting mechanism 80, and the like.

Next, action of the reflow apparatus 70 will be described by referring to FIG. 6-FIG. 10. The action is controlled by the control device 75.

First, the substrate 20 is placed within the container 30, and the solder composition 10 is dropped from the above by using a dispenser. Then, the container 30 is placed at the container holder 33 at the entrance/exit part 74. The operation up to this point may be performed automatically or by a worker. Subsequently, the ring motor 86 is revolved for transporting the container 30 to the next preliminary heating section 71. At this time, the containers 30 positioned at the preliminary heating section 71, the reflow section 72, and the cooling section 73 are transported to the reflow section 72, the cooling section 73, and the inlet/outlet section 74, respectively. At the start and end of the transportation, the air cylinder 85 is actuated through an electromagnetic valve, not shown, for moving the container 30 together with the container holder 83 vertically.

The container 30 is heated in the preliminary heating section 71 for a specific time so that it is heated to a specific temperature. Subsequently, the ring motor 86 is revolved for transporting the container 30 to the next reflow section 72. At the reflow section 72, the container 30 is heated for a specific time so that the solder composition 10 is reflown. Then, the ring motor 86 is revolved for transporting the container 30 to the next cooling section 73. At the cooling section 73, the container 30 is cooled for a specific time so that it is cooled to a specific temperature. Further, the ring motor 86 is revolved for transporting the container 30 to the next entrance/exit part 74. There, the container 30 is detached from the container holder 83, thereby completing the reflow step.

With the reflow apparatus 70, it is possible to form the solder bumps with the solder composition 10 by using the heating device 40 for the preliminary heating section 71 and the reflow section 72 even though it is a heater using the hot air 41. The first reason for this is that oxidation of the solder composition 10 can be suppressed because the hot air 41 does not move around to the above. The second reason is that the temperature distribution of the solder composition 10 becomes lower on the top-face side and higher on the substrate 20 side.

Furthermore, the preliminary heating section 71 and the reflow section 72 may stop the supply of hot air from the hot-air generating unit 52 according to a command from the control device 75 when the opening 47 is not covered by the container 30 as shown in FIG. 7. In this case, for example, action of the blower 44 may be stopped or ejection of the hot air 41 may be suppressed by using a barrier plate, not shown. With this, it is possible to prevent the hot air 41 from being ejected from the opening 47 when the opening 47 is not covered by the container 30.

Further, when a plurality of the containers 30 are successively circulated for processing by using the reflow apparatus 70, a dummy container (not shown) may be fed before, after, or in the middle of the plurality of containers. The dummy container suppresses ejection of the hot air 41 from the opening 47 when the opening 47 is not covered by the container 30 as well as fluctuation of the thermal capacity from the view point of the heating device 40. When the dummy container is formed in the same shape as that of the container 30, fluctuation of the thermal capacity in terms of the heating device 40 can be suppressed more. Further, the cooling section 73 may be omitted.

Needless to say, the present invention is not limited to the above-described embodiment. For example, a fine-pitch substrate, interposer, and a wiring board (BGA) may be used instead of a silicon wafer (FC). Furthermore, the electrode material is not limited to aluminum but Al—Si, Al—Si—Cu, Al—Cu, Cu, etc. may be used.

Figure 11:
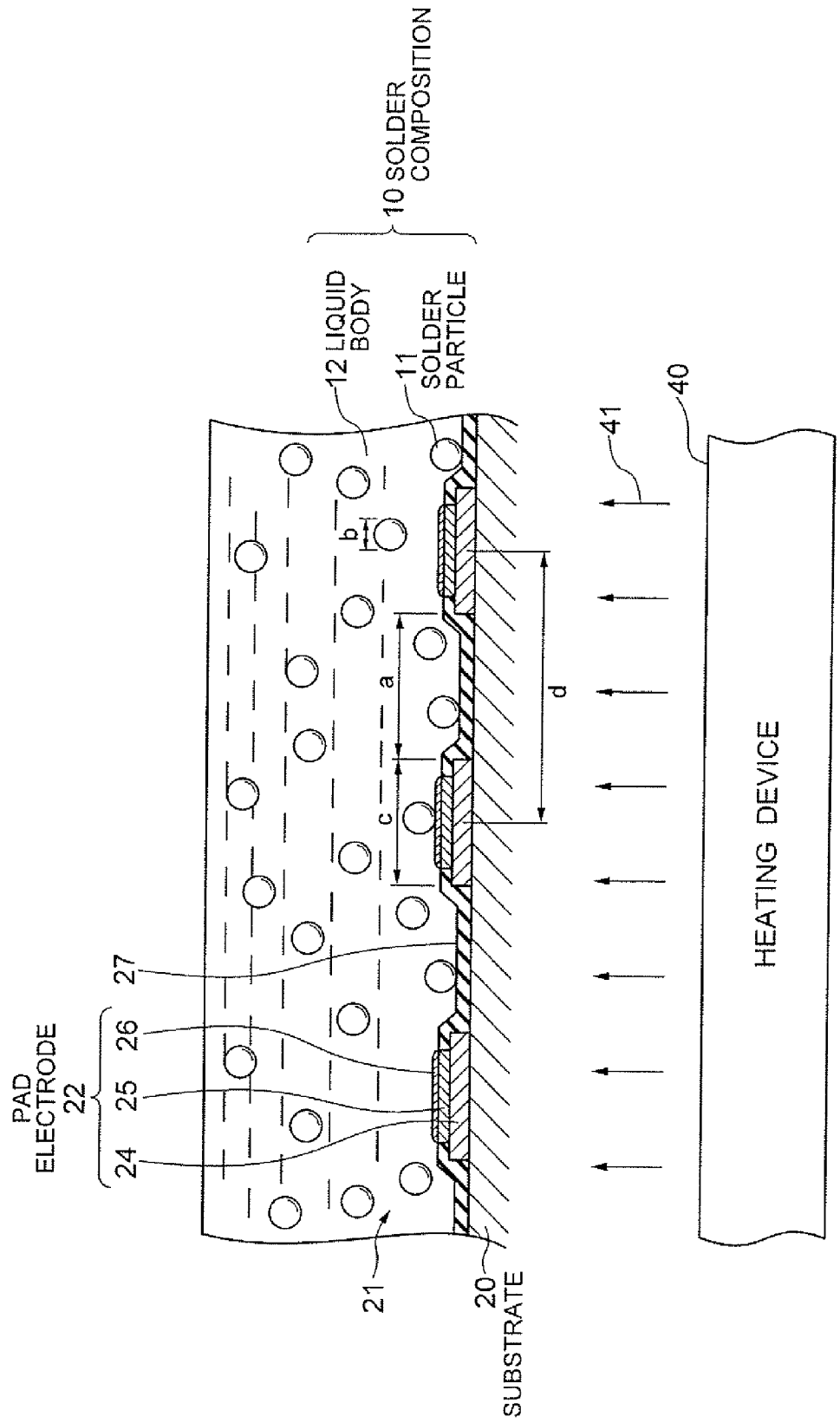
FIG. 11 A cross section for showing a first embodiment of the solder bump forming method according to the present invention.

FIG. 11 is a cross section for showing the solder bump forming method according to an embodiment of the present invention. Description will be provided hereinafter by referring to this illustration. FIG. 11 shows the state where the solder composition is applied over the substrate, in which the vertical view thereof is enlarged compared to the lateral view.

The solder composition 10 used in this embodiment is a mixture of a great number of solder particles 11 and the liquid body (liquid material) 12 made of fatty ester, which is used for forming the solder bumps on the pad electrodes 22. The liquid body 12 has such a viscosity that it spreads in a uniform thickness by the weight of itself when dropped on the substrate 20 at a normal temperature and exhibits a flux effect that causes solder wet on the pad electrodes 22 by the solder particles 11 when heated to the melting point of the solder particles 11 or higher. The solder particles 11 have such a mixing ratio and a particle diameter that they are spread and dispersed together with the liquid body 12 when dropped on the substrate 20 with the liquid body 12.

Further, the solder particles 11 have only a natural oxide film (not shown) on the surface. The liquid body 12 is fatty ester so that it originally contains free fatty acid that is a kind of organic acid. The free fatty acid accelerates the soldering between the solder particles 11 and the pad electrodes 22, while suppressing coalescence of the solder particles 11 by the reaction product thereof when heated to the melting point of the solder particle 11 or higher. At the same time, it exhibits an effect of accelerating coalescence of the solder coating formed on the pad electrodes 22 and the solder particles 11.

The organic acid contained in the liquid body 12 may be added as necessary. That is, the content of the organic acid in the liquid body 12 is controlled in accordance with the degree of oxidation and the amount of the solder particles 11. For example, there is required a large amount of solder particles 11 when forming a large number of solder bumps. Thus, it is necessary to contain sufficient organic acid for deoxidizing the oxide film of all the solder particles 11. In the meantime, when there is added an excessive amount of solder particles 12 that is more than the amount used for forming the bumps, the content of the organic acid is reduced for decreasing the activating power of the liquid body 12 so that the fine solder particles 11 in terms of the particle size distribution of the solder powder are not melted. With this, it is possible to form the optimum bumps with only the relatively larger solder particles 11. The fine solder particles that are not melted remained at this time have an effect of decreasing short-circuit of the pad electrodes 22 by preventing coalescence of the solder particles 11.

It is necessary for the solder particles 11 to be uniformly dispersed in the liquid body 12, so that it is desirable for the solder composition 10 to be stirred right before the use. For a material of the solder particles 11, there is used tin-lead type solder, lead-free solder, or the like. It is preferable for the diameter b of the solder particle 11 to be smaller than the shortest distance a between the peripheral ends of the adjacent pad electrodes 22.

The solder composition 10 is dropped on the substrate 20 with the pad electrodes 22 by natural fall at a normal temperature. Only with this, the solder composition 10 with a uniform thickness can be applied over the substrate 20. That is, it is possible to form a coating film of the solder composition 10 with a uniform thickness on the substrate 20 without using screen printing and a dispenser. The uniformity of the coating influences the dispersions in the solder bumps, so that it should be applied uniformly as much as possible. Then, the entire substrate 20 is heated uniformly for allowing formation of the solder bumps. The heating temperature is increased to the melting point or higher in a short time. Through increasing the temperature in a short time, deterioration in the activating force of organic acid during the process can be suppressed.

Next, the substrate 20 used in this embodiment will be described. The substrate 20 is a silicon wafer. The pad electrodes 22 are formed on the top-face 21 of the substrate 20. The solder bumps are formed on the pad electrodes 22 by the forming method of the embodiment. The substrate 20 is connected electrically and mechanically to another semiconductor chip or wiring board through the solder bumps. The shape of the pad electrode 22 is circular, for example, having the diameter c of 40 µm, for example. The distance d between the centers of the adjacent pad electrodes 22 is 80 µm, for example. The diameter b of the solder particle 11 is 3-15 µm, for example.

The pad electrode 22 is constituted with an aluminum electrode 24 formed on the substrate 20, a nickel layer formed on the aluminum electrode 24, and a metal layer 26 formed on the nickel layer 25. The nickel layer 25 and the metal layer 26 are UBM (under barrier metal or under bump metallurgy) layers The part on the substrate 20 other than the pad electrodes 22 is covered by a protection film 27.

Next, a forming method of the pad electrodes 22 will be described. First, the aluminum electrode 24 is formed on the substrate 20, and the protection film 27 is formed with a polyimide resin or silicon nitride film over the part except the aluminum electrode 24. These are formed by using photolithography and etching, for example. After applying zincate treatment on the surface of the aluminum electrode 24, the nickel layer 25 and the metal layer 26 are formed on the aluminum electrode 24 by electroless plating. The UBM layers are provided for supplying the solder wettability to the aluminum electrode 24.

For the material of the solder particles 11, there are used Sn—Pb (melting point at 183° C.), Sn—Ag—Cu (melting point at 218° C.), Sn—Ag (melting point at 221° C.), Sn—Cu (melting point at 227° C.), or the like.

The heating device 40 is constituted with the blower and electric heater, for example, and it heats the solder composition 10 by blowing the hot air 41 from the substrate 20 side (from the bottom side).

FIG. 12 and FIG. 13 are cross sections for showing the first embodiment of the solder bump forming method according to the present invention. FIG. 12 illustrates the dropping step as an example of application step, which proceeds in order of FIG. 12-FIG. 12. FIG. 13 illustrates the reflow step, which proceeds in order of FIG. 13-FIG. 13. Description will be provided hereinafter by referring to those illustrations. However, the same reference numerals are applied to the components that are same as those of FIG. 11, and the descriptions thereof are omitted.

In FIG. 12, illustrations of the pad electrodes 22 on the substrate 20 are omitted. First, as shown in FIG. 12, the substrate 20 is placed in the receiver container 30. Then, after stirring the solder composition 10 in a pouring container 31 as necessary, the solder composition 10 is dropped from a pourer 32 on the substrate 20. Upon this, the solder composition 10 spreads into a uniform thickness by the weight of itself. At this time, the temperature may be at a normal temperature and, moreover, natural fall of the solder composition 10 can be utilized. A printing machine or discharge device may be used for applying the solder composition 10 on the substrate 20.

The receiver container 30 is heated along with the substrate 20 in the reflow step. Thus, it is made of a metal such as aluminum that exhibits heat resistance and fine thermal conduction, and causes no solder wet by the solder particles 11. Further, the receiver container 30 has a flat bottom face 33 for placing a flat-plate-type substrate 20, and a surrounding wall 34 for preventing the lateral overflow of the solder composition 10. In this case, the substrate 20 comes in contact closely with the bottom face 33 of the receiver container 30, thereby improving the thermal conduction. In FIG. 1 and FIG. 3, illustration of the receiver container 30 is omitted.

Furthermore, during or after the dropping step, the substrate 20 may be rotated horizontally so that the thickness of the solder composition 10 on the substrate 20 becomes uniform For rotating the substrate 20 horizontally, a spin-coating device on the market may be used.

End of the dropping step can be classified into two types depending on whether or not the solder composition 10 is dropped until the substrate 20 is immersed in the solder composition 10. FIG. 12 shows the case where the substrate 20 is not immersed in the solder composition 10. In this case, thickness t1 of the solder composition 10 on the substrate 20 is a value determined in accordance mainly with the surface tension and the viscosity of the solder composition 10. In the meantime, FIG. 12 shows the case where the substrate 20 is immersed in the solder composition 10. In this case, thickness t2 of the solder composition 10 on the substrate 20 can be set as a desired value in accordance with the amount of the solder composition 10 to be dropped.

Through the above-described dropping step, the solder composition 10 is applied solid over the substrate 20 on which a plurality of pad electrodes 22 are provided with a space therebetween as shown in FIG. 11. At this time, the solder composition 10 is applied all over the face including the plurality of the pad electrodes 22 and the protection film 27 formed between the gaps thereof. The solder composition 10 is in a state just like an ink.

Then, when heating of the substrate 20 and the solder composition 10 is started in the reflow step, the viscosity of the liquid body 12 is deteriorated further. With this, as shown in FIG. 13, the solder particles 11 precipitate and pile up over the pad electrodes 22 and the protection film 27, since the specific gravity of the solder particles 11 is larger than that of the liquid body 12.

Subsequently, as shown in FIG. 13, the solder composition 10 is heated up to the melting point of the solder particles 11 or higher. The solder composition 10 on the substrate 20 is heated from the substrate 20 side, so that the temperature of the solder composition 10 becomes lower towards the top-face side and becomes higher towards the substrate 20 side. Thus, the lower solder particles 11 near the pad electrode 22 starts to melt first and, when melted, they are wet and spread over the pad electrode 22. At that time, the upper solder particles 11 far from the pad electrode 22 has not sufficiently melted yet. Thus, it is possible to reduce the risk of uniting the solder particles 11 with each other, thereby suppressing generation of solder bridges as well. In other words, in the reflow step, first, the pad electrode 22 is heated up to the melting point of the solder particles 11 or higher for melting the solder particles 11 that are in contact with the pad electrode 22 so as to form a coating 23' wet and spread over the pad electrode 22, and the solder particles 11 are further united with the solder coating 23'.

At this time, due to the effect of the organic acid contained in the liquid body 12, there is induced a following state. First, coalescence of the solder particles 11 can be suppressed. Although not shown in FIG. 13, however, part of the solder particles 11 are united with each other and become larger. In other words, it is not an issue even though the solder particles 11 are united with each other as long as it is in a specific size or smaller. In the meantime, the solder particles 11 spread over the pad electrode 22 and form an alloy layer on the interface. As a result, the solder coating 23' is formed on the pad electrode 22, and the solder particles 11 are united further with the solder coating 23'. That is, the solder coating 23' grows into a solder bump 23 as shown in FIG. 12.

In FIG. 13, the solder particles 11 that are not used for forming the solder bumps 23 are washed off along with the remaining liquid body 12 in a latter step.

Further, in the reflow step, the solder particles 11 closer to the substrate 20 side may be precipitated first by providing such a temperature difference in the solder composition 10 that the top-face side thereof is lower and the substrate 20 side is higher. By providing such temperature difference that the top-face side of the solder composition 10 is lower and the substrate 20 side is higher, the lower solder particles 11 near the pad electrode 22 precipitate and start to melt first, and become wet and spread when coming in contact with the pad electrode 22, since the viscosity deteriorates more as the temperature of the liquid body 12 becomes higher. In that state, the upper solder particles 11 far from the pad electrode 22 have not sufficiently precipitated and melted. Thus, the risk of uniting the solder particles 11 with each other can be more reduced, so that generation of the solder bridges can be suppressed more. Further, such heating state can be achieved by, for example, heating the solder composition 10 on the substrate 20 from the substrate 20 side while controlling the temperature of the solder composition 10 from the top-face side, and controlling the relation between the temperature dependency of the viscosity of the liquid body 12 and the melting point of the solder particles, etc.

Furthermore, in the reflow step, the solder particles 11 may be supplied to the pad electrode 22 by utilizing convection of the liquid body 12. When the solder composition 10 is heated from the substrate 20 side, convection is generated in the liquid body 12 so that the solder particles 11 move within the liquid body 12. Thus, the solder particles 11 that are not placed on the pad electrode 22 are shifted on the pad electrode 22 to be a part of the solder bump 23. Thereby, the solder particles 11 can be utilized efficiently.

Figure 14:
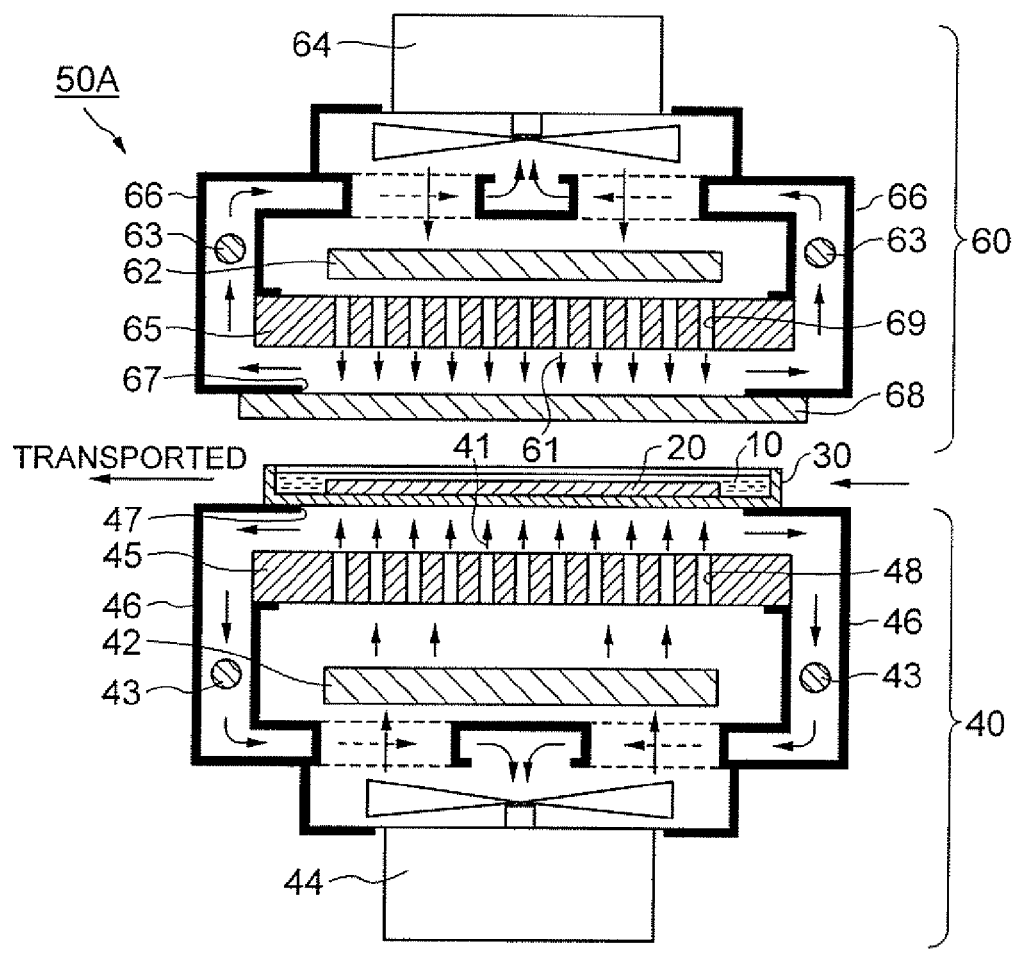
FIG. 14 A schematic cross section for showing a first embodiment of a solder bump forming apparatus according to the present invention.

FIG. 14 is a schematic cross section for showing a bump forming apparatus according to an embodiment of the present invention. Description will be provided hereinafter by referring to this illustration. However, the same reference numerals are applied to the components that are same as those of FIG. 11 FIG. 13, and the descriptions thereof are omitted. The "receiver container 30" is simply referred to as the "container 30".

A solder forming apparatus 50A of this embodiment is for forming solder bumps by heating and reflowing the solder composition 10 on the substrate 20, which comprises the heating device 40 for heating the solder composition 10 from the substrate 20 side and the thermostat device 60 for controlling the temperature of the solder composition 10.

The heating device 40 is constituted with a main heating source 42, a sub-heating source 43, a blower 44, a heat storage member 45, a hot-air circulation duct 46, an opening 47, etc. The main heating source 42 and the sub-heating source 43 may be electric heaters, for example. The heat storage member 45 is made of an aluminum material, for example, on which a great number of transparent holes 48 are formed for letting through the hot air 41. The hot air 41 is circulated by the blower 44. That is, the hot air 41 circulates through the circulation path from the main heating source 42→the heat storage member 45→the opening 47 (heat the container 30)→the circulation duct 46→the sub-heating source 43→the hot-air circulation duct 46→the blower 44→the main heating source 42. The heating device 40 is capable of heating the entire substrate more uniformly compared to those utilizing the thermal conduction because it applies heat by blowing the hot air 41 to the container 30.

The thermostat device 60 is constituted with a main thermostat source 62, a sub-thermostat source 63, a blower 64, a cool storage (or heat storage) member 65, a circulation duct 66, an opening 67, a heat absorbing plate (or radiation plate) 68, and the like. The thermostat device 60 uses cool air for the thermostat medium 61. The main thermostat source 62 and the sub-thermostat source 63 maybe coolant coolers, for example. The cool storage member 65 is made of an aluminum material, for example, on which a great number of transparent holes 69 are formed for letting through the cool air 61. It is desirable that the heat absorbing plate 68 be made of an aluminum material, for example, and the solder composition 10 side be in a state close to a black body. The cool air 61 is circulated by the blower 64. That is, the cool air 61 circulates through the circulation path from the main thermostat source 62→the cool storage (or heat storage) member 65→the opening 67 (cool the heat absorbing plate 68)→the circulation duct 66→the sub-thermostat source 63→the circulation duct 66→the blower 64→the main thermostat source 62. The heat absorbing plate 68 has a function of absorbing the heat of the solder composition 10, and the structures of the thermostat device 60 other than the heat absorbing plate 68 constitutes an endothermic section that can continuously allow the heat absorbing plate 68 to exhibit the heat absorbing function by absorbing the heat of the heat absorbing plate 68. In that case, the main thermostat source 62 and the sub-thermostat source 63 work as functions for cooling the thermostat medium 61. In the description provided above, the thermostat device 60 has been described as the structure for providing a temperature difference between the top-face side and the substrate side of the solder composition 10 by depriving the heat of the solder composition 10. However, it is not intended to be limited to this. That is, the thermostat device 60 maybe structured to heat the solder composition 10 by radiant heat. In that case, the heat absorbing plate 68 functions as a radiation plate for heating the solder composition 10 by the radiant heat, and the structures other than the radiation plate 68 constitutes a heating section that can continuously allow the radiation plate 68 to exhibit the heating function by heating the radiation plate 68. When heating the solder composition 10 by the thermostat device 60, the heating temperature may be set as same as the temperature heated by the heating device 40 or higher. The thermostat device 60 in both cases employs the system where the cool air or hot air of the thermostat medium 61 does not directly come in contact with the solder composition 10 on the substrate 20. Thus, there is no bad influence to be imposed on the solder composition 10 deposited in layers.

Next, action of the solder bump forming apparatus 50A will be described. The solder composition 10 is heated by the heating device 40 from the substrate 20 side and, at the same time, the temperature of the solder composition 10 is controlled by the thermostat device 60 from the top-face side. With this, the temperature distribution of the solder composition 10 becomes higher towards the substrate 20 side and lower towards the top-face side. In this state, as described above, the risk of uniting the solder particles with each other can be reduced, so that the generation of the solder bridges can be suppressed as well. Therefore, dense and fine solder bumps can be formed easily.

Figure 15:
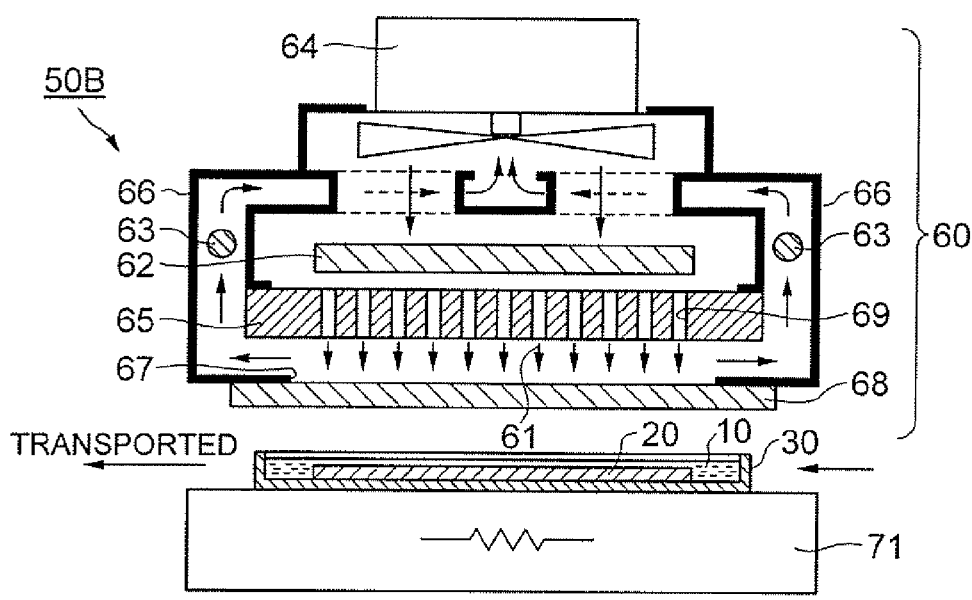
FIG. 15 A schematic cross section for showing a second embodiment of the solder bump forming apparatus according to the present invention.

FIG. 15 is a schematic cross section for showing a second embodiment of the solder bump forming apparatus according to the present invention. Description will be provided hereinafter by referring to this illustration. However, the same reference numerals are applied to the components that are the same as those of FIG. 14, and the descriptions thereof are omitted.

The solder bump forming apparatus 50B of this embodiment uses a heating device 71 that utilizes thermal conduction, instead of the heating device 40 that utilizes the hot air 41 as shown in FIG. 14. The heating device 71 is an electric heater such as a panel heater, for example, which is in a simple structure where the container 30 is directly placed and heated by the thermal conduction. With the bump forming apparatus 50B, the structure can be more simplified compared to that of the first embodiment.

Needless to say, the present invention is not limited to the above-described embodiments. For example, a wiring board (BGA) may be used instead of a silicon wafer (FC) Furthermore, the electrode material is not limited to aluminum but Al—Si, Al—Si—Cu, Al—Cu, Cu, etc. may be used.

EXAMPLE 1

EXAMPLE 1 as a more concrete example of this embodiment will be described hereinafter.

The solder particles used therein had the composition of Sn(96.5 wt %)-Ag(3.0 wt %)-Cu(0.5 wt %) with the melting point at 218° C., and the average diameter thereof was 6 μm (particle size distribution of 2-11 μm). A kind of (trimethylpropanetrioleate) of fatty ester was used for the liquid body. The main characteristic of fatty ester is that the kinematic viscosity at 40° C. is 48.3 mm$^2$/s, the kinematic viscosity at 100° C. is 9.2 mm$^2$/s, and the acid value is 2.4. An organic acid was not added and those originally contained in free fatty acid were utilized. Further, vacuum deaeration with less than the vapor pressure of water was performed on the fatty ester for suppressing the influence of moisture as much as possible.

For the substrate for forming the solder bumps, a silicon chip with 10 mm square was used. On the silicon chip, pad electrodes in 80 μm pitch were formed in a two-dimensional-array form. The shape of the pad electrode was 40 μm square. The material for the top face of the pad electrode was a gold plating with a thickness of a decimal of several microns formed on an electroless nickel plating. The material for the protection film was silicon nitride.

What is claimed is:

1. A solder bump forming apparatus for forming a solder bump through heating and reflowing a solder composition on a substrate where a plurality of pad electrodes are provided, wherein the solder composition is made of a mixture of solder particles and a liquid material that contains a flux component, which becomes liquid at a normal temperature or when heated, the solder bump forming apparatus comprising:

a heating device provided for heating the solder composite from a first side of the substrate, wherein the heating device blows hot air, and wherein the blowing hot air of the heating device does not directly come in contact with the solder composition on the substrate within a space through which the substrate is conveyed;

a thermostat device for controlling a temperature of the solder composition is provided at a position above a mount plate, which is located over a second side of the substrate, wherein the thermostat device includes a system in which a cool air or hot air of the thermostat device does not directly come in contact with the solder composition on the substrate within the space;

the thermostat device being enclosed within a thermostat enclosure and the heating device being enclosed within a heating device enclosure, the thermostat enclosure and heating device enclosure preventing all blowing air of the solder bump forming apparatus from being blown within the space through which the substrate is conveyed, the thermostat enclosure including a thermostat circulation duct that defines at least part of a thermostat circulation path within the thermostat enclosure, and the heating device enclosure including a heating device circulation duct that defines at least part of a heating circulation path within the heating device enclosure;

the thermostat device having a thermostat blower, a main thermostat, a cool/heat storage member, a heat absorbing plate, and a sub-thermostat source;

the heating device having a heat blower, a main heating source, a heat storage member, an opening that is covered, and a sub-heating source; and the thermostat blower circulates a thermostat medium along the thermostat circulation path, wherein the thermostat circulation path provides a thermostat flow path from the main thermostat source, through the cool/heat storage member, along the heat absorbing plate, through the thermostat circulation duct having the sub-thermostat source therein, to the thermostat blower, and returning to the main thermostat source, and the heat blower circulates hot air along the heating circulation path, wherein the heating circulation path provides a heating flow path from the main heating source, though the heat storage member, along the covered opening, through the heating device circulation duct having the sub-heating source therein, to the heat blower, and returning to the main heating source.

2. The solder bump forming apparatus as claimed in claim 1, wherein the thermostat device comprises a radiation plate for heating the solder composition by radiant heat and a heating section for heating the radiation plate.

3. The solder bump forming apparatus as claimed in claim 1, wherein the heat absorbing plate deprives heat of the solder composition, and the thermostat device comprises an endothermic section for cooling the heat absorbing plate.

4. The solder bump forming apparatus as claimed in claim 1, wherein the heating device applies heat by blowing hot air to a bottom side of the substrate.

5. The solder bump forming apparatus as claimed in claim 1, wherein the heating device heats a bottom side of the substrate by thermal conduction.

6. The solder bump forming apparatus as claimed in claim 1, wherein:

the substrate is immersed in the solder composition within a container; and the heating device heats the solder composition from the first side of the substrate through the container.

* * * * *

UNITED STATES PATENT AND TRADEMARK OFFICE
CERTIFICATE OF CORRECTION

| | | |
|---|---|---|
| PATENT NO. | : 8,042,727 B2 | |
| APPLICATION NO. | : 10/598142 | |
| DATED | : October 25, 2011 | |
| INVENTOR(S) | : M. Shirai et al. | |

It is certified that error appears in the above-identified patent and that said Letters Patent is hereby corrected as shown below:

At column 26, line 42 (claim 1) of the printed patent, please change "though" to --through-- after source.

Signed and Sealed this
Twenty-ninth Day of May, 2012

David J. Kappos
*Director of the United States Patent and Trademark Office*